United States Patent
Juengling

(10) Patent No.: US 8,866,254 B2
(45) Date of Patent: Oct. 21, 2014

(54) DEVICES INCLUDING FIN TRANSISTORS ROBUST TO GATE SHORTS AND METHODS OF MAKING THE SAME

(75) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1525 days.

(21) Appl. No.: 12/033,780

(22) Filed: Feb. 19, 2008

(65) Prior Publication Data
US 2009/0206443 A1 Aug. 20, 2009

(51) Int. Cl.
H01L 21/28 (2006.01)
H01L 29/40 (2006.01)
H01L 27/108 (2006.01)
H01L 29/78 (2006.01)
H01L 29/66 (2006.01)

(52) U.S. Cl.
CPC .... H01L 27/10879 (2013.01); H01L 27/10876 (2013.01); H01L 29/7851 (2013.01); H01L 29/66795 (2013.01)
USPC ............ 257/506; 257/E21.158; 257/E29.111; 438/589

(58) Field of Classification Search
USPC .................. 257/315–330, 401, 331; 438/283
See application file for complete search history.

(56) References Cited

U.S. PATENT DOCUMENTS

| | | | |
|---|---|---|---|
| 3,885,861 A | 5/1975 | Farnsworth et al. |
| 5,160,987 A | 11/1992 | Pricer et al. |
| 5,196,910 A | 3/1993 | Moriuchi et al. |
| 5,661,061 A | 8/1997 | Usuami et al. |
| 5,821,513 A | 10/1998 | O'Hagan et al. |
| 5,858,829 A | 1/1999 | Chen |
| 5,925,918 A | 7/1999 | Wu et al. |
| 5,949,057 A | 9/1999 | Feng |
| 6,008,513 A | 12/1999 | Chen |
| 6,043,562 A | 3/2000 | Keeth |
| 6,081,008 A | 6/2000 | Rostoker |
| 6,100,129 A | 8/2000 | Tu et al. |
| 6,130,551 A | 10/2000 | Agrawal et al. |
| 6,216,257 B1 | 4/2001 | Agrawal et al. |

(Continued)

FOREIGN PATENT DOCUMENTS

| | | |
|---|---|---|
| DE | 19946719 | 4/2001 |
| JP | 2006054431 | 2/2006 |

(Continued)

OTHER PUBLICATIONS

Enrico Gilt; "Fabrication of Vertical MOSFETs With Reduced Parasitics and Suppression of Short Channel Effects"; Department of Electronics and Compter Science, Microelectronics Group; University of Southampton, Jun. 2004 http://66.102.1.104/scholar?hl=en&lr=&q=cache:BErKI49qg2MJ:www.ecs.soton.ac.uk/~eg02r/Publications/MinithesisEGili.pdf+dram+fins+%22process+flow%22+%22vertical+access%22.

(Continued)

Primary Examiner — David Vu
Assistant Examiner — Jonathan Han
(74) Attorney, Agent, or Firm — Fletcher Yoder PC

(57) ABSTRACT

Disclosed are methods, systems and devices, including a method that includes the acts of etching an inter-row trench in a substrate, substantially or entirely filling the inter-row trench with a dielectric material, and forming a fin and a insulating projection at least in part by etching a gate trench in the substrate. In some embodiments, the insulating projection includes at least some of the dielectric material in the inter-row trench.

22 Claims, 37 Drawing Sheets

(56) References Cited

U.S. PATENT DOCUMENTS

| | | |
|---|---|---|
| 6,258,656 B1 | 7/2001 | Lange et al. |
| 6,258,659 B1 | 7/2001 | Gruening et al. |
| 6,268,243 B1 | 7/2001 | Park |
| 6,282,113 B1 | 8/2001 | DeBrosse |
| 6,316,309 B1 | 11/2001 | Holmes et al. |
| 6,380,759 B1 | 4/2002 | Agrawal et al. |
| 6,432,769 B1 | 8/2002 | Fukuda et al. |
| 6,440,792 B1 | 8/2002 | Shiao et al. |
| 6,689,660 B1 | 2/2004 | Noble et al. |
| 6,845,033 B2 | 1/2005 | Kirihata et al. |
| 6,897,107 B2 | 5/2005 | Divakaruni et al. |
| 6,927,462 B2 | 8/2005 | Goodwin et al. |
| 6,967,147 B1 | 11/2005 | Tews et al. |
| 6,998,666 B2 | 2/2006 | Beintner et al. |
| 7,015,106 B2 | 3/2006 | Yoon et al. |
| 7,091,543 B2 | 8/2006 | Tzeng et al. |
| 7,098,105 B2 | 8/2006 | Juengling |
| 7,099,216 B2 | 8/2006 | Luk et al. |
| 7,132,333 B2 | 11/2006 | Schloesser et al. |
| 7,151,023 B1 | 12/2006 | Nayfeh et al. |
| 7,176,067 B2 * | 2/2007 | Jung et al. ............ 438/144 |
| 7,190,060 B1 | 3/2007 | Chiang |
| 7,195,995 B2 | 3/2007 | Mouli |
| 7,205,606 B2 | 4/2007 | Tran |
| 7,345,937 B2 | 3/2008 | Yoon et al. |
| 7,432,162 B2 * | 10/2008 | Chung et al. ............ 438/270 |
| 7,442,976 B2 | 10/2008 | Juengling |
| 7,476,933 B2 | 1/2009 | Juengling |
| 7,816,208 B2 | 10/2010 | Kujirai |
| 2001/0003034 A1 | 6/2001 | Furukawa et al. |
| 2002/0155656 A1 | 10/2002 | Hayano et al. |
| 2003/0168676 A1 | 9/2003 | Itabashi et al. |
| 2003/0198073 A1 | 10/2003 | Keeth |
| 2004/0027848 A1 | 2/2004 | Wald et al. |
| 2004/0043592 A1 | 3/2004 | Goodwin et al. |
| 2004/0062069 A1 | 4/2004 | Keeth |
| 2004/0125636 A1 | 7/2004 | Kurjanowicz et al. |
| 2004/0202027 A1 | 10/2004 | Kuzmenka et al. |
| 2005/0133852 A1 | 6/2005 | Shau |
| 2005/0151206 A1 | 7/2005 | von Schwerin |
| 2005/0196918 A1 | 9/2005 | von Schwerin |
| 2005/0245024 A1 | 11/2005 | von Schwerin |
| 2006/0006446 A1 | 1/2006 | von Schwerin |
| 2006/0046407 A1 * | 3/2006 | Juengling ............ 438/301 |
| 2006/0057814 A1 | 3/2006 | Weis |
| 2006/0073662 A1 | 4/2006 | Jang et al. |
| 2006/0076602 A1 | 4/2006 | Harter et al. |
| 2006/0131651 A1 | 6/2006 | Sato et al. |
| 2006/0189078 A1 * | 8/2006 | Juengling ............ 438/257 |
| 2006/0244106 A1 | 11/2006 | Morikado |
| 2006/0246607 A1 | 11/2006 | Fazan et al. |
| 2006/0270151 A1 | 11/2006 | Lee |
| 2006/0273415 A1 | 12/2006 | Kim |
| 2006/0281250 A1 | 12/2006 | Schloesser |
| 2007/0010058 A1 | 1/2007 | Juengling |
| 2007/0023805 A1 | 2/2007 | Wells et al. |
| 2007/0052040 A1 | 3/2007 | Schwerin |
| 2007/0111455 A1 | 5/2007 | Kim et al. |
| 2007/0121414 A1 | 5/2007 | Butler |
| 2007/0134878 A1 | 6/2007 | Brask et al. |
| 2007/0145450 A1 | 6/2007 | Wang et al. |
| 2007/0166933 A1 | 7/2007 | Song et al. |
| 2007/0170522 A1 | 7/2007 | Lee et al. |
| 2007/0176221 A1 | 8/2007 | Nakamura |
| 2007/0176222 A1 | 8/2007 | Ikemasu et al. |
| 2007/0176253 A1 | 8/2007 | Wang et al. |
| 2007/0190736 A1 | 8/2007 | Liu et al. |
| 2007/0262375 A1 | 11/2007 | Juengling |
| 2008/0012053 A1 * | 1/2008 | Kujirai ............ 257/288 |
| 2008/0023757 A1 * | 1/2008 | Kujirai ............ 257/331 |

FOREIGN PATENT DOCUMENTS

| | | |
|---|---|---|
| KR | 930005234 | 6/1993 |
| KR | 20020018071 | 3/2002 |
| TW | 380316 | 1/2000 |
| TW | 388125 | 4/2000 |
| WO | WO 9728532 | 8/1997 |
| WO | WO 0161738 | 8/2001 |
| WO | WO 0231878 | 4/2002 |
| WO | WO 0249100 | 6/2002 |
| WO | WO 2004/038770 | 5/2004 |

OTHER PUBLICATIONS

F. Fishburn, et al.; "A 78nm 6F2 DRAM Technology for Multigigabit Densities".

J. Sturm, et al.; "Increased Transconductance in Fully-Depleted Ultra-Thin Sillicon-on-Insulator MOSFETs"; 6 pages.

R. Katsumata, et al.; "Fin-Array-FET on bulk silicon for sub-100 nm Trench Capacitor DRAM"; 2003 Symposium on VLSI Technology Digest of Technical Papers; Jun. 2003, pp. 61-62.

T. Park, et al.; "Fabrication of Body-Tied FinFETs (Oega MOSFETs) Using Bulk Si Wafers"; 2003 Symposium on VLSI Technology Digest of Technical Papers; Jun. 2003, 2 pages.

U.S. Appl. No. 12/033,768, filed Feb. 19, 2008, Werner Juengling.
U.S. Appl. No. 12/033,799, filed Feb. 19, 2008, Werner Juengling.
U.S. Appl. No. 12/043,813, filed Mar. 6, 2008, Werner Juengling.
U.S. Appl. No. 12/052,300, filed Mar. 20, 2008, Werner Juengling.
U.S. Appl. No. 12/052,317, filed Mar. 20, 2008, Werner Juengling.
U.S. Appl. No. 12/052,537, filed Mar. 20, 2008, Werner Juengling.
U.S. Appl. No. 12/062,354, filed Apr. 3, 2008, Werner Juengling.
U.S. Appl. No. 12/130,825, filed May 30, 2008, Werner Juengling.

Betty Prince, Ph.D.; "Trends in Scaled and Nanotechnology Memories"; Memory Strategies International; Leander, Texas; 2005.

Branislav Curanovic; "Development of a Fully-Depleted Thin-Body FinFET Process"; Department of Microelectronic Engineering, College of Engineering; Rochester Institute of Technology; Rochester, New York; Nov. 2003.

Claeys, Cor; "Technological Challenges of Advanced CMOS Processing and Their Impact on Design Aspects"; Proceedings of the 17th International Conference on VLSI Design (VLSID '04); 1063-9667/04; IEEE Computer Society; Leuven, Belgium.

J-H. Ahn, S-H. Hong, S-J. Kim, J-B. Ko, S-W. Shin, S-D. Lee, Y-W. Kim, K-S. Lee, S-K. Lee, S-E. Jang, J-H. Choi, S-Y. Kim, G-H. Baw, S-W. Park, Y-J. Park, "An Experimental 256Mb Non-Volatile DRAM with Cell Plate Boosted Programming Technique" IEEE International Solid-State Circuits Conference, ISSCC 2004 / Session 2 / Non-Volatile Memory / 2.2, 2004.

Bor-Wen Chan, Min-Hwa Chi, Liou, Y.H; Notch Elimination in Polycide Gate Stack Etching for Advanced DRAM Technology; Center for Technol. Dev., Worldwide Semicond. Manuf. Corp., Hsinchu; http://ieeexplore.ieee.org/xpl/freeabs_all.jsp?tp=&arnumber=883094&isnumber=19090.

Chien Yu, Rich Wise, Anthony Domenicucci; A Two-Step Spacer Etch for High-Aspect-Ration Gate Stack Process; IBM Microelectronics; http://www.mrs.org/s_mrs/s_mrs/sec_subscribe.asp?CID=2353&DID=113693&ation=detail.

Ikeda, H., Inukai, H.; High-Speed DRAM Architecture Development; NEC Corp., Sagamihara; Solid-State Circuits, IEEE Journal; May 1999; vol. 34, Issue 5, pp. 685-692; http://ieeexplore.ieee.org/xpls/abs_all.jsp?arnumber=760380&isnumber=16453.

Endoh, T., Shinmei, K., Sakuraba, H., Masuoka, F.; New Three-Dimensional Memory Array Architecture for Future Ultrahigh-Density DRAM; Res. Inst. of Electrical Communication, Tohoku University, Sendai; Solid-State Circuites, IEEE Journal; Apr. 1999; vol. 34, Issue 4, pp. 476-483; http://ieeexplore.ieee.org/xpls/abs_all.jsp?arnumber=753680.

Takashima, D., Nakano, H.; A Cell Transistor Scalable DRAM Array Architecture; Memory LSI Res. & Dev. Center, Toshiba Corporation, Yokohama; Solid-State Circuits, IEEE Journal; May 2002; vol. 37, Issue 5, pp. 587-591; http://ieeexplore.ieee.org/xpls/abs_all.jsp?arnumber=997851.

(56) References Cited

OTHER PUBLICATIONS

Johgn-Man Park, Sang-Yeon Han, Chang-Hoon Jeon, Si-Ok Sohn, Jun-Bum Lee, Yamada, S., Shin-Deuk Kim, Wook-Je Kim; Wouns Yang, Donggun Park, Byung-Il Ryu; Fully Integrated Advanced Bulk FinFETs Architecture Featuring Partially-Insulating Technique for DRAM Cell Application of 40nm Generation and Beyond; http://ieeexplore.ieee.org/xpl/freeabs_all.jsp?arnumber=4154360.

Examination Report for European Application No. 09712651.0-1508 and Communication Pursuant to Article 94(3) EPC dated Jan. 16, 2014.

* cited by examiner

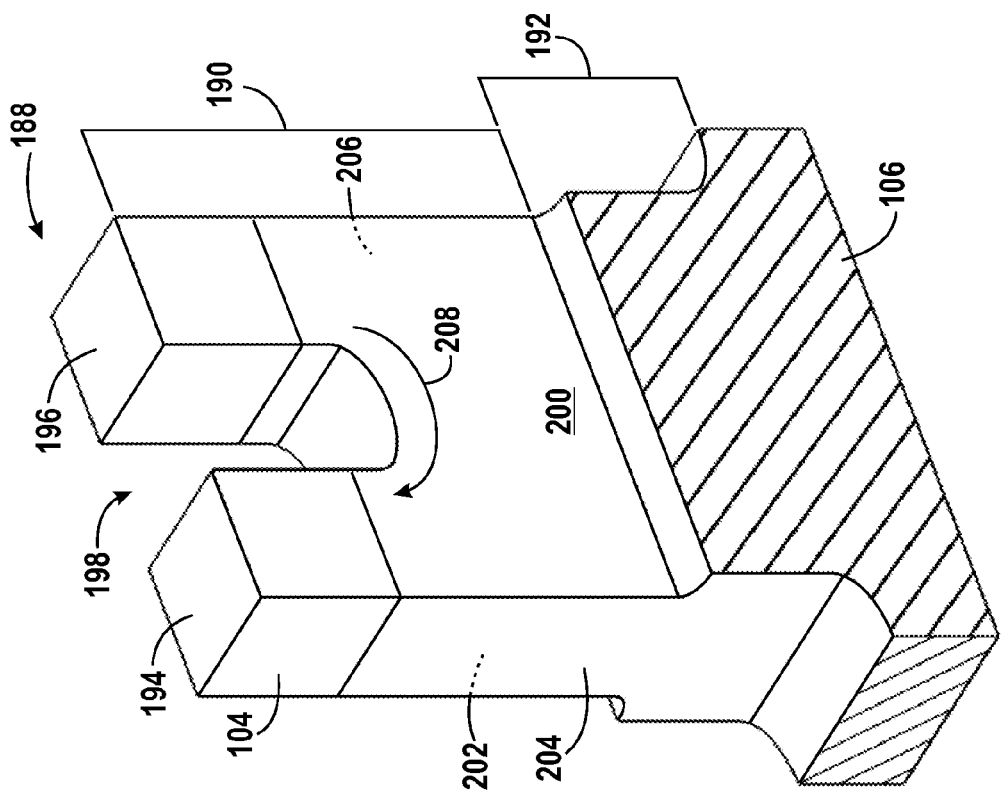
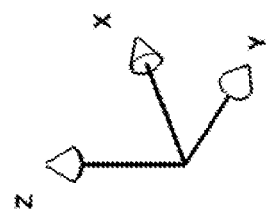
FIG. 27

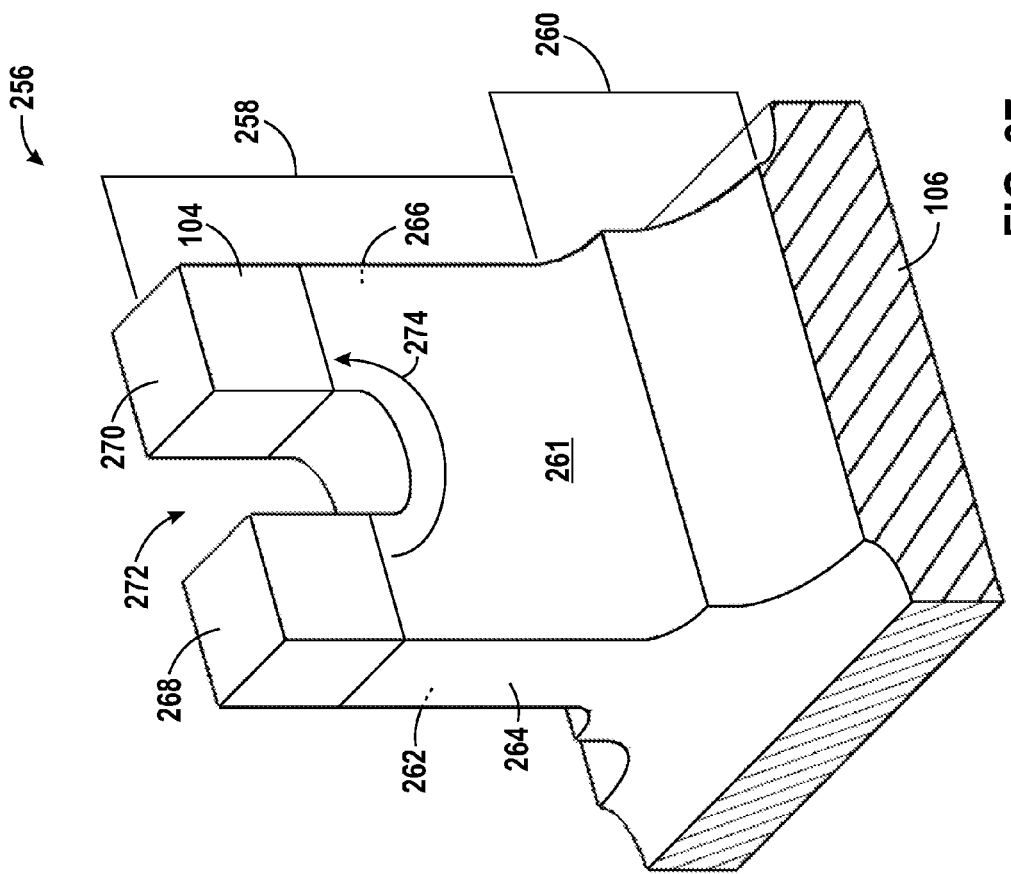
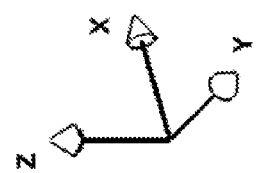
FIG. 37

DEVICES INCLUDING FIN TRANSISTORS ROBUST TO GATE SHORTS AND METHODS OF MAKING THE SAME

BACKGROUND

1. Field of Invention

Embodiments of the invention relate generally to electronic devices and, more specifically, in certain embodiments, to fin transistors.

2. Description of Related Art

Fin field-effect transistors (finFETs) are often built around a fin (e.g., a tall, thin semiconductive member) rising generally perpendicularly from a substrate. Typically, a gate traverses the fin by conformally running up one side of the fin, over the top, and down the other side of the fin. In some instances, the gate is disposed against the sides of the fin and does not extend over the top. Generally, a source and a drain are located on opposite sides of the gate, near the ends of the fin. In operation, a current through the fin between the source and drain is controlled by selectively energizing the gate.

Some finFETs include gates formed with a sidewall-spacer process. In some versions of this process, the gates are formed by covering a fin with a conformal, conductive film and, then, anisotropically etching the conductive film. During the etch, the conductive material is removed faster from the horizontal surfaces than from the vertical surfaces. As a result, a portion of the conductive material remains against the vertical sidewalls of the fins, thereby forming the gate. An advantage of this process is that relatively narrow gates can be formed relative to gates patterned with photolithography, which is often subject to alignment and resolution constraints.

Although forming gates with a sidewall-spacer process avoids some process issues, it can introduce other failure mechanisms. Often the sidewalls of the fins are angled rather than vertical because the fins were formed with an etch that is less than perfectly anisotropic. These angled sidewalls can narrow, and in some cases close, the process window for the sidewall spacer. The angles place the bases of adjacent fins closer to one another, and when the conformal film is deposited in this narrower gap, the portions of the film covering the adjacent sidewalls can join, creating a film with a larger vertical thickness in the gap. The film can become so thick in the gap that the sidewall-spacer etch does not remove all of the conductive film between adjacent gates. The resulting conductive residue may form stringers that short adjacent finFETs and lower yields.

BRIEF DESCRIPTION OF DRAWINGS

FIGS. 1-27 illustrate a manufacturing process in accordance with an embodiment of the present technique; and FIGS. 28-37 illustrate another manufacturing process in accordance with an embodiment of the present technique.

DETAILED DESCRIPTION

Figure 1:
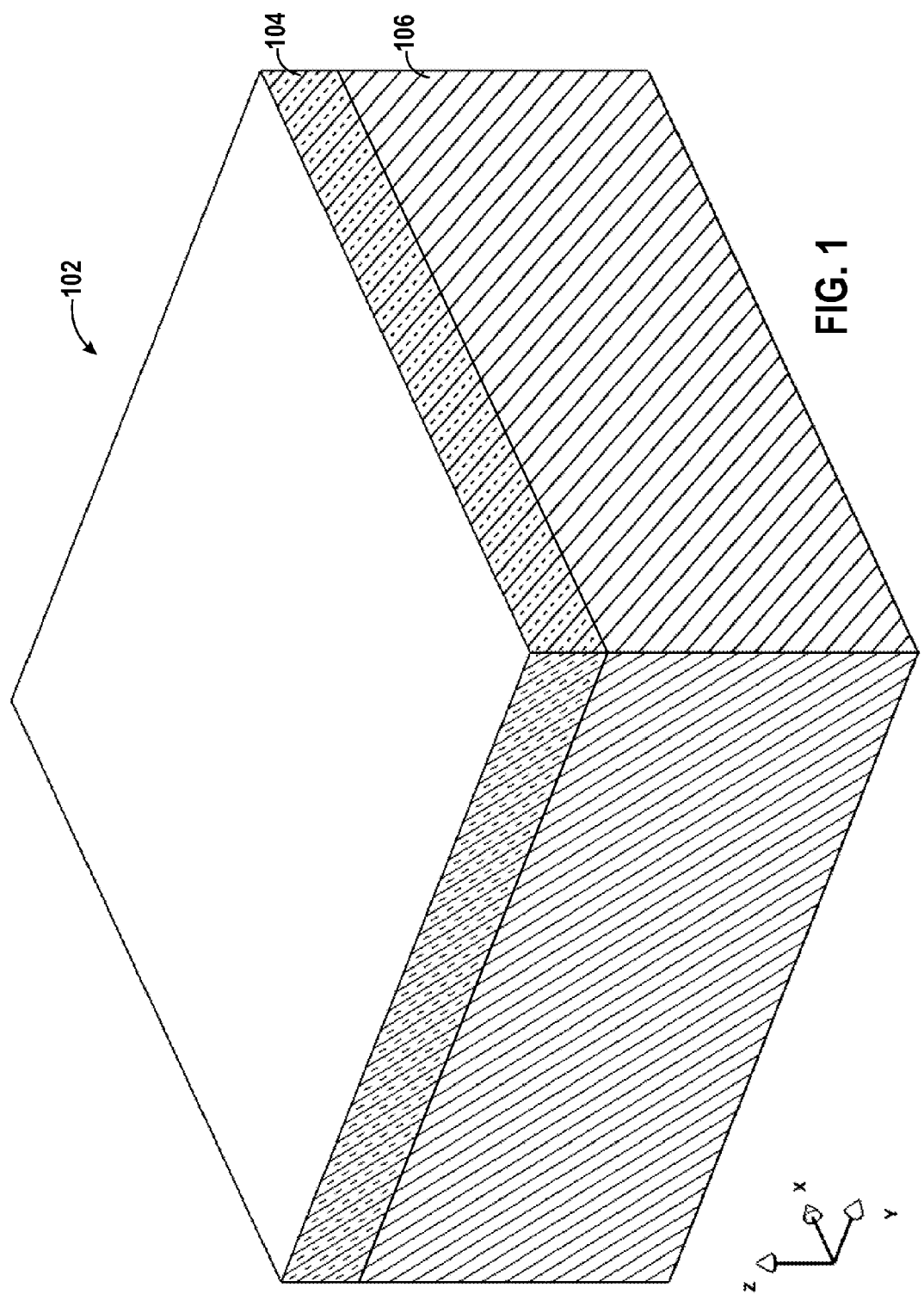

As illustrated by FIG. 1, the manufacturing process begins with providing a substrate 102. The substrate 102 may include semiconductive materials such as single-crystal or poly-crystalline silicon, gallium arsenide, indium phosphide, or other materials with semiconductor properties. Alternately, or additionally, the substrate 102 may include a non-semiconductor body on which an electronic device may be constructed, bodies such as a plastic or ceramic work surface. The term "substrate" encompasses these structures in a variety of stages of manufacture, and may include any material comprising a semiconductive material, including an unprocessed-whole wafer, a partially-processed-whole wafer, a fully-processed-whole wafer, a portion of a diced wafer, or a portion of a diced wafer in a packaged-electronic device.

In this embodiment, the substrate 102 includes an upper-doped region 104 and a lower-doped region 106. The upper-doped region 104 and the lower-doped region 106 may be differently doped. For example, the upper-doped region 104 may include an n+ material and the lower-doped region 106 may include a p− material. The depth of the upper-doped region 104 may be generally uniform over a substantial portion of the substrate 102, such as throughout a substantial portion of an array area of a memory device. The upper-doped region 104 and the lower-doped region 106 may be doped by implanting or diffusing dopant materials. Alternatively, or additionally, one or both of these regions 104 or 106 may be doped during growth or deposition of all or part of the substrate 102, such as during epitaxial deposition of a semiconductive material or during growth of a semiconductive ingot from which wafers are cut. As explained below, the upper-doped region 104 may provide material used to form a source and a drain of a transistor, and the lower-doped region 106 may provide material used to form a channel of the transistor.

Figure 2:
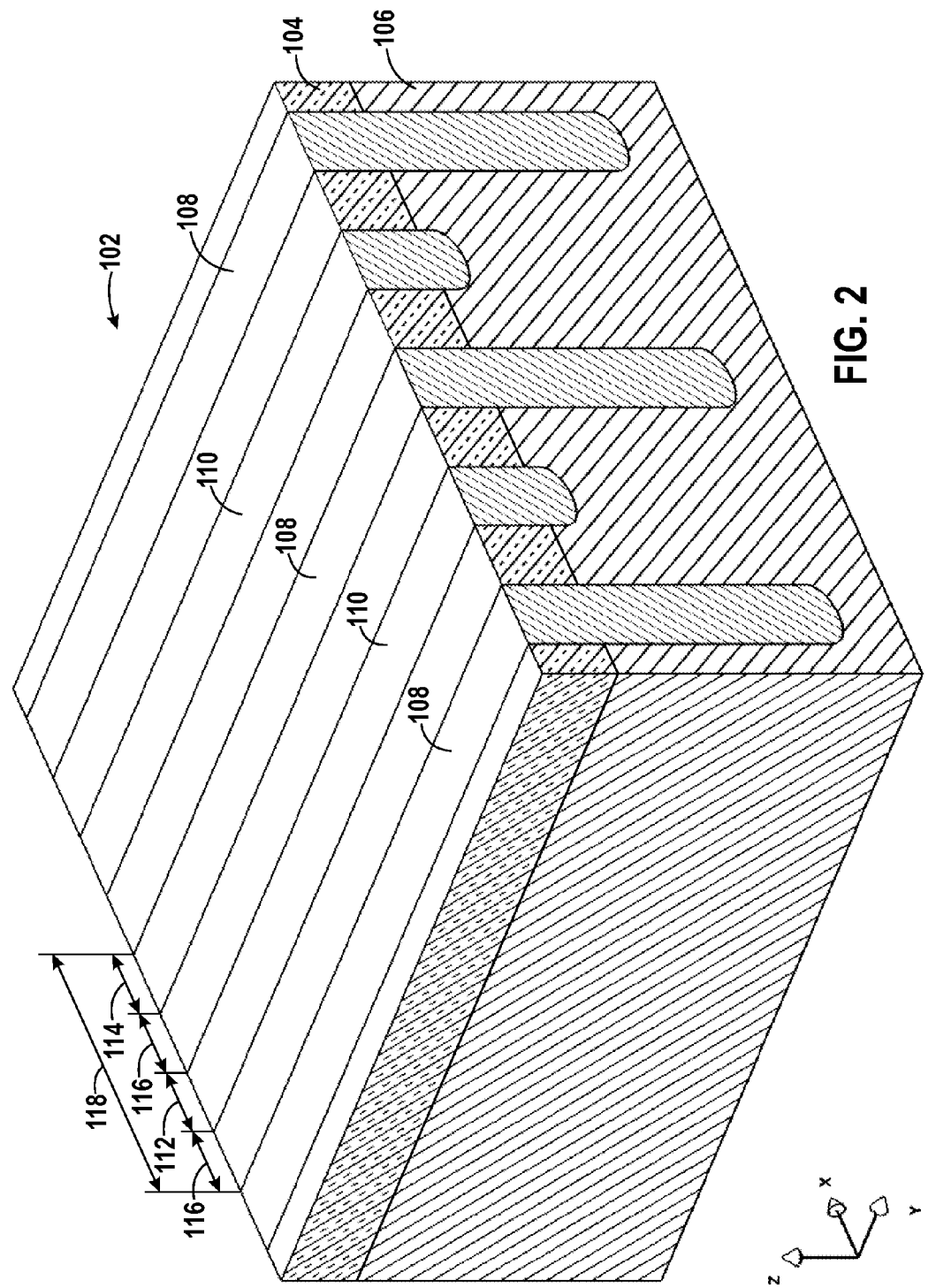

Deep-isolation trenches 108 and shallow trenches 110 may be formed in the substrate 102, as illustrated by FIG. 2. These trenches 108 and 110 may generally extend in the Y direction. One or more shallow trenches 110 may be interposed between pairs of the deep-isolation trenches 108. In some embodiments, the shallow trenches 110 may be deeper than the upper-doped region 104 to separate subsequently-formed sources and drains. Additionally, the deep-isolation trenches 108 may be substantially deeper than the shallow trenches 110 to isolate subsequently-formed transistors.

The deep-isolation trenches 108 and the shallow trenches 110 may define several dimensions of the substrate 102. The shallow trenches 110 have a width 112 less than or generally equal to F, the resolution of the equipment with which the deep-isolation trenches are patterned, e.g., the photolithographic-resolution limit. Similarly, the deep-isolation trenches 108 may have a width 114 less than or generally equal to F, and the deep-isolation trenches 108 may be spaced away from the shallow trenches 110 by a width 116 that is less than or generally equal to F. In some embodiments, one or more or all of these widths 112, 114, and 116 is less than or generally equal to ¾ F, ½ F, or ¼ F. The trenches 108 and 110 repeat with a period of 118, which in some embodiments, is less than or generally equal to 4 F, 2 F, or 1 F. The deep-isolation trenches 108 and shallow trenches 110 may have a generally rectangular or trapezoidal cross-section, and in some embodiments, their cross-section may be generally uniform through some distance in the Y direction, for example through a distance larger than one, two, five, or more transistor lengths (e.g., a distance corresponding to the largest dimension of a subsequently formed transistor).

The deep-isolation trenches 108 and shallow trenches 110 may be partially or entirely filled with various dielectric materials, such as high density plasma (HDP) oxide, tetra-ethyl-ortho-silicate (TEOS), or spun-on-glass (SOG), for instance, to electrically isolate features. Additionally, the deep-isolation trenches 108 or the shallow trenches 110 may include various liner materials, such as silicon nitride for example, to relieve film stresses, improve adhesion, or function as a barrier material. In some embodiments, prior to being filled, the bottom of the deep-isolation trenches 108 is implanted with dopants selected to further isolate subsequently-formed transistors.

Figure 3:
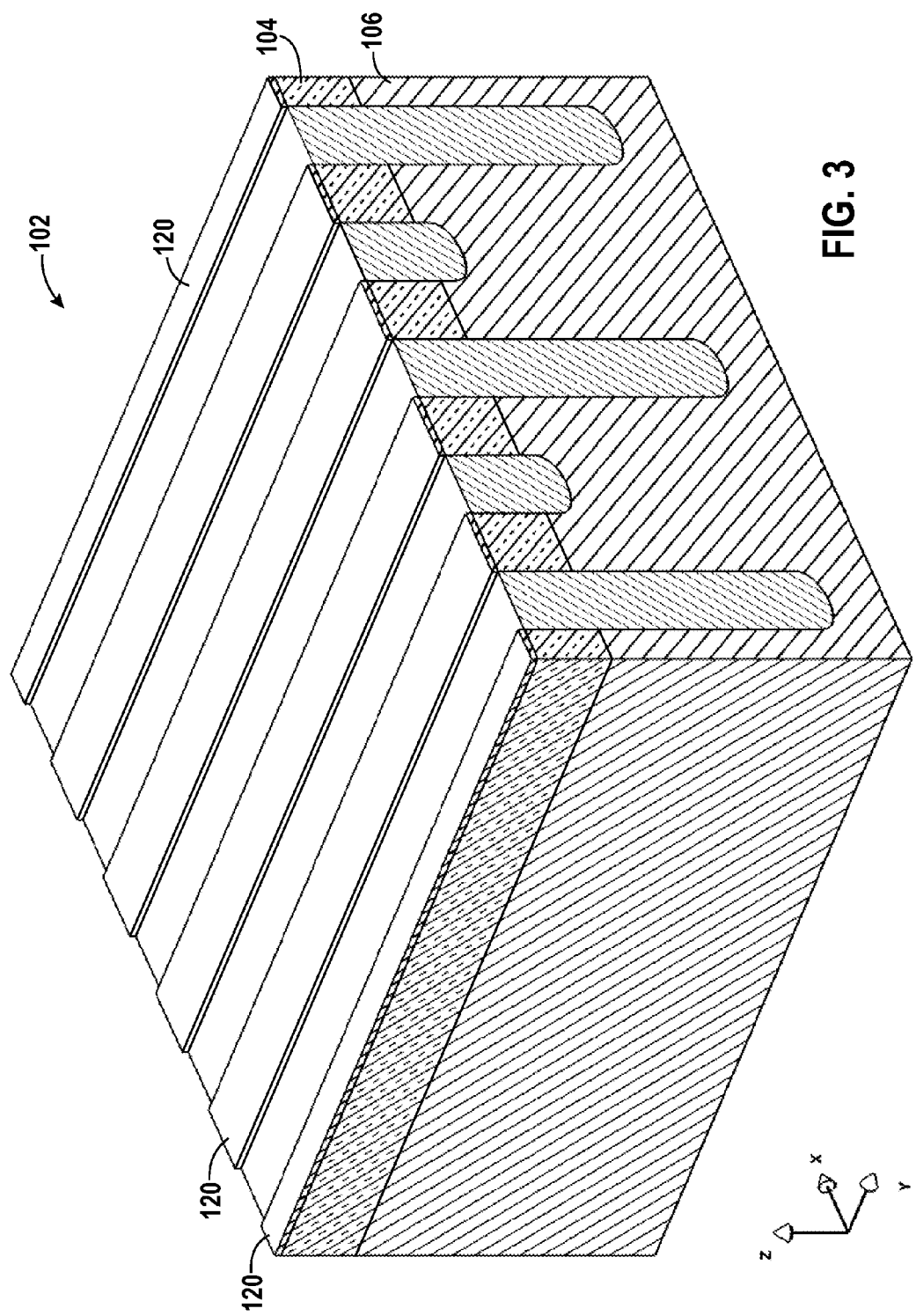

Next, a buffer region 120 is formed, as illustrated by FIG. 3. The buffer region 120 may be oxide grown by exposing the substrate 102 to oxygen, e.g., in a furnace. Alternatively, or additionally, the buffer region 120 may be deposited, e.g., in a chemical-vapor-deposition (CVD) chamber. The illustrated buffer region 120 is a grown oxide, so it is primarily disposed on exposed portions of the upper-doped region 104. The buffer region 120 may have a thickness less than 300 Å, e.g., between 30 Å and 150 Å. In some embodiments, the buffer region 120 may reduce the likelihood of subsequent films and processes forming stress-induced defects in the upper-doped region 104 or the lower-doped region 106.

Figure 4:
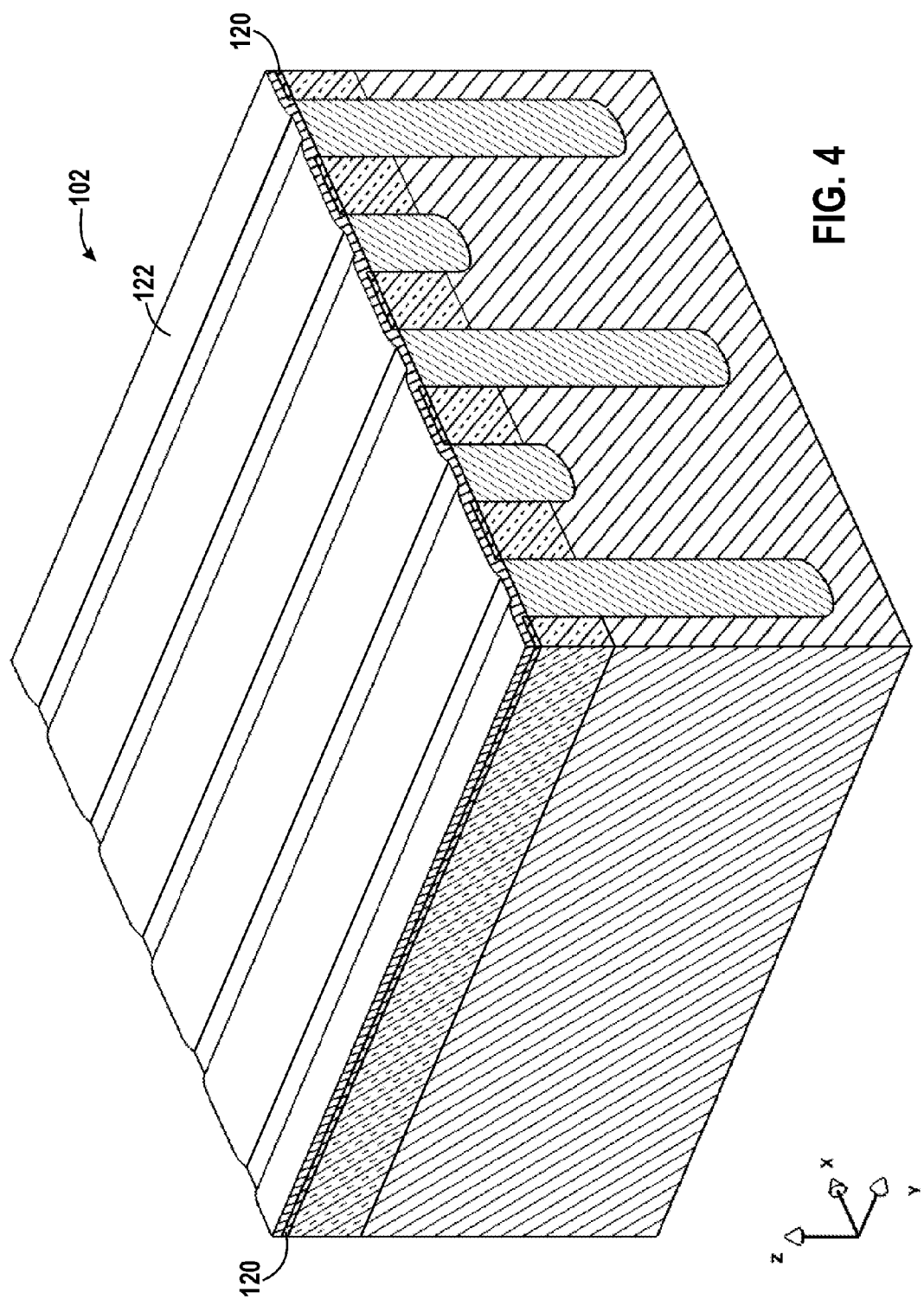

A stop region 122 may be formed conformally on the buffer region 120, as illustrated by FIG. 4. The stop region 122 may be a nitride layer, and it may have a thickness less than 1000 Å, e.g., between 100 Å and 500 Å. As explained below, in some embodiments, the stop region 122 can function as an etch or CMP stop (e.g., it may slow an etch or chemical-mechanical planarization (CMP) process) before the process penetrates the upper doped region 104. Additionally, in some embodiments, the transition to the stop region 122 may signal the appropriate time to stop one of these processes.

Figure 5:
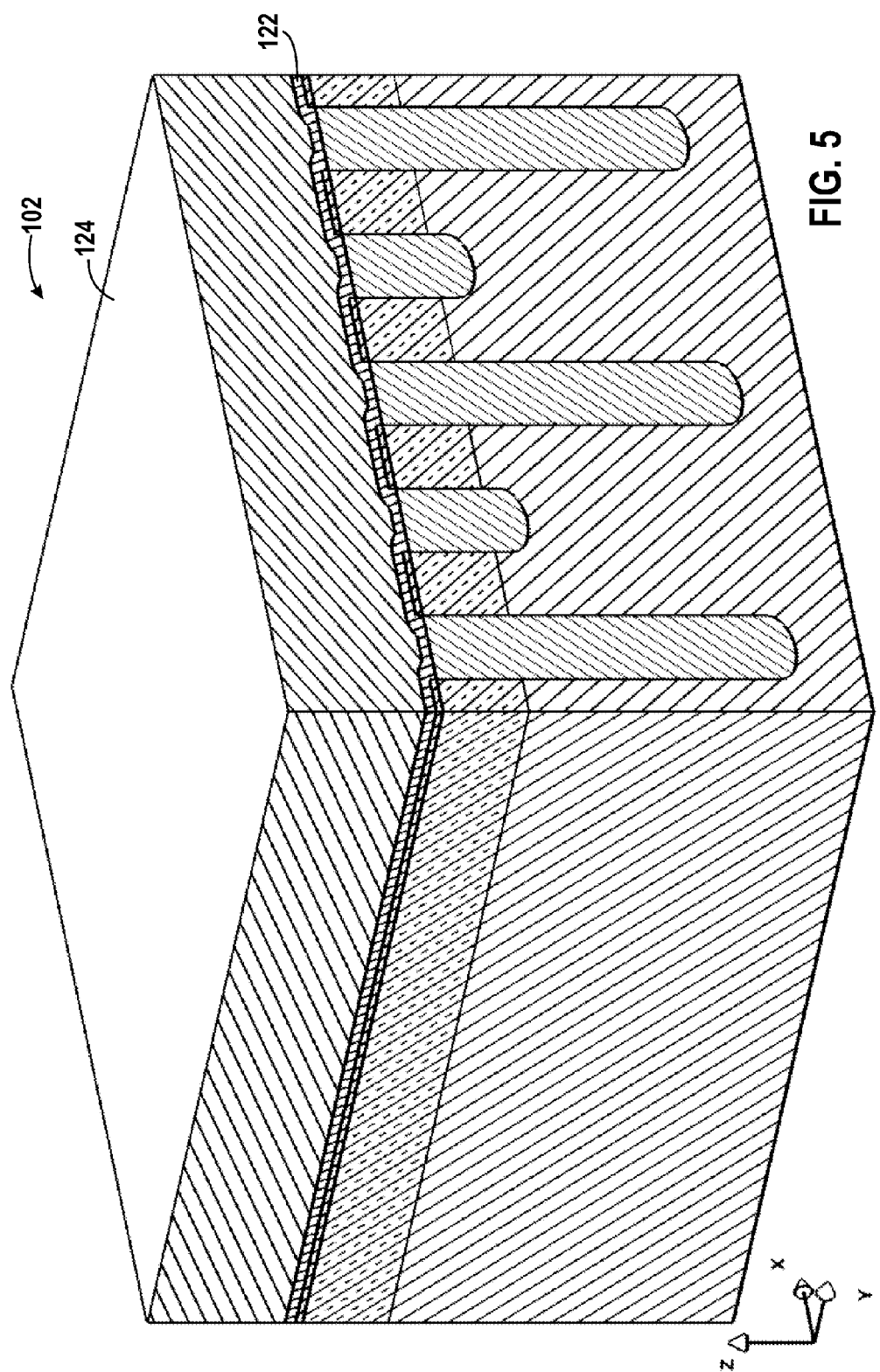

Next, a lower-sacrificial region 124 may be formed on the stop region 122, as illustrated by FIG. 5. In some embodiments, the lower-sacrificial region 124 is a blanket film made of polysilicon with a thickness between 200 Å and 5000 Å, e.g., between 500 Å and 3,000 Å. As explained below, material from this region 124 may form a generally vertical face on which a sidewall spacer is formed.

Figure 6:
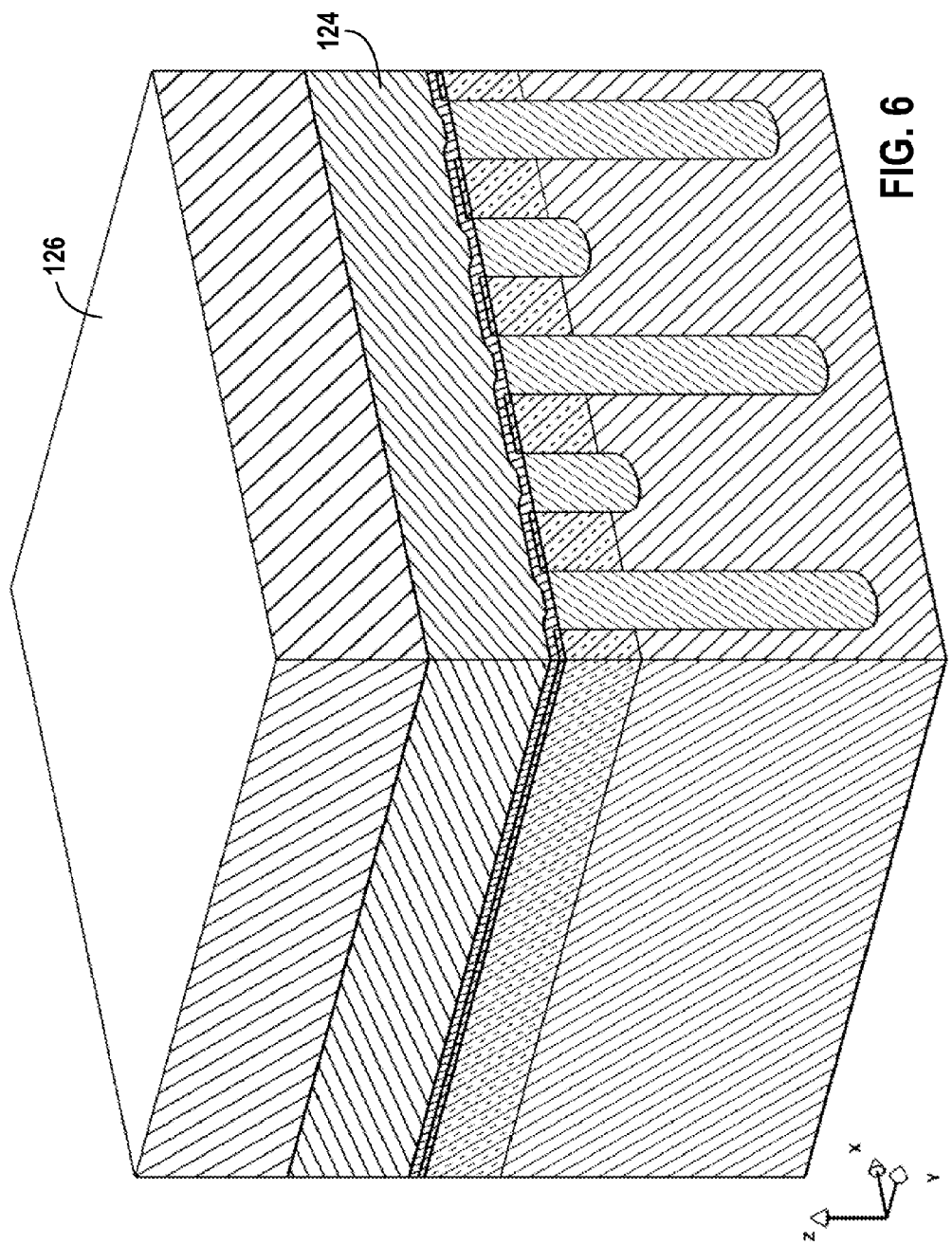

As illustrated by FIG. 6, an upper-sacrificial region 126 may be formed on the lower-sacrificial region 124. In this embodiment, the upper-sacrificial region 126 is made of a different material from the lower-sacrificial region 124 to facilitate selective removal of the upper-sacrificial region 126 during a subsequent step. The upper-sacrificial region 126 may be made of a variety of materials, such as oxide, and it may have a thickness between 200 Å and 3000 Å, e.g., between 500 Å and 1500 Å. Additionally, or alternatively, in some embodiments, an amorphous-carbon-masking layer may be formed on the upper-sacrificial region 126. In other embodiments, the upper-sacrificial region 126 and in the masking region may be omitted, which is not to suggest that any of the other features discussed herein may not also be omitted.

Figure 7:
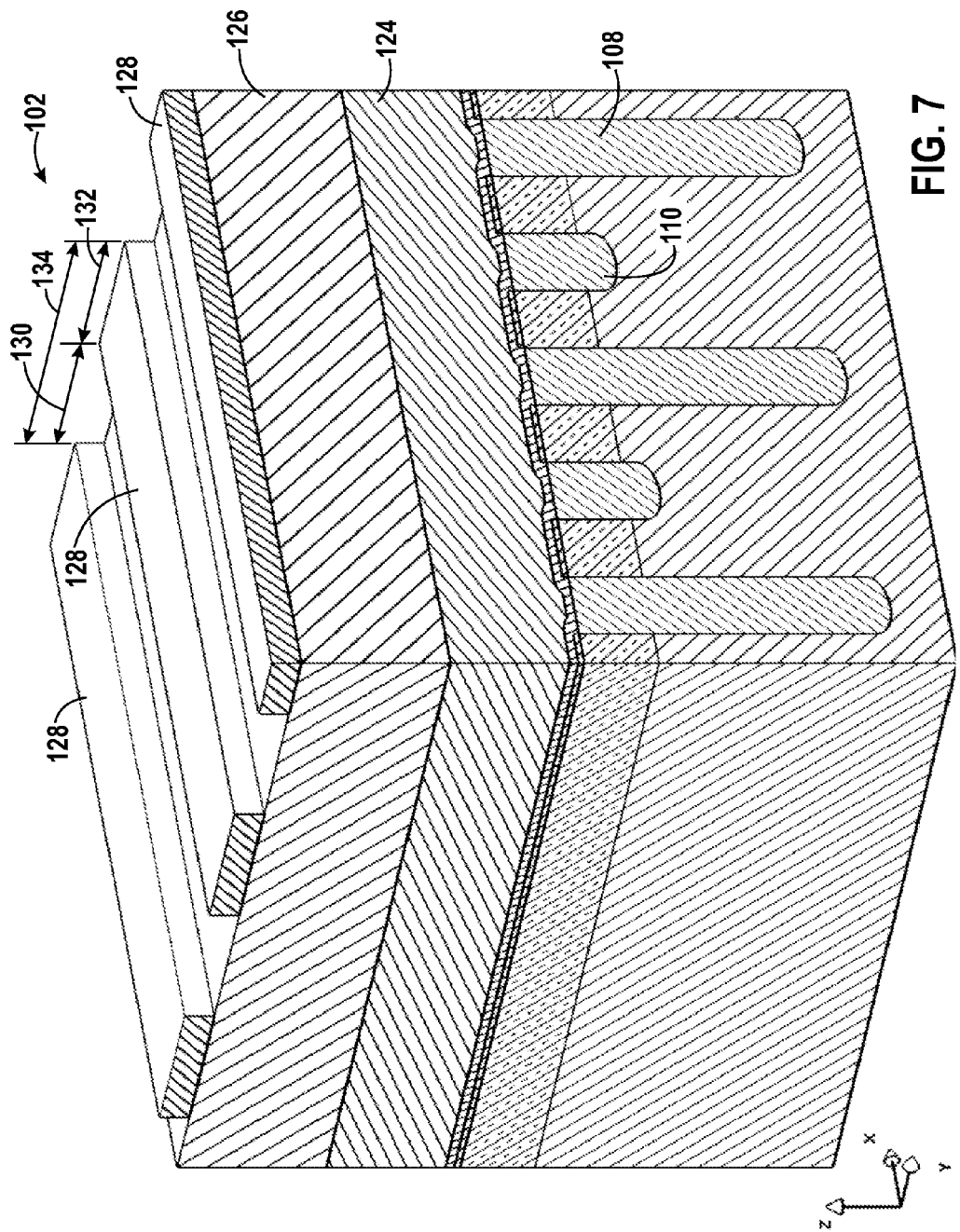

Next, a fin mask 128 is formed on the upper-sacrificial region 126, as illustrated by FIG. 7. The fin mask 128 may be patterned with a variety of lithography systems, such as a photolithography system, an electron-beam system, or a nano-imprint system. In some embodiments, the fin mask 128 is formed using a photolithography system having a light source with a 193 nm wavelength. The fin mask 128 includes exposed regions having a width 130 and masked regions having a width 132. In some embodiments, the widths 130 and 132 are generally equal to each other and each generally equal to 1 F. The fin mask 128 may repeat with a period 134 that is generally equal to 2 F. The exposed regions and the masked regions may be generally parallel to each other and are generally perpendicular to both the deep-isolation trenches 108 and the shallow trenches 110. Additionally, in some embodiments, the exposed regions and the masked regions may have a generally uniform cross-section over a substantial distance in the X direction, e.g., over a distance corresponding to five or more transistors. In some embodiments, the fin mask 128 is disposed in an array portion of the substrate 102 and does not extend into a periphery portion of the substrate 102. As explained below, the fin mask 128 may generally define the position and spacing of subsequently-formed fins, isolation trenches, and gates.

In certain embodiments, the fin mask 128 has a relatively large alignment margin compared to some conventional processes. Many of the existing structures on the substrate 102, such as the deep-isolation trenches 108 and the shallow trenches 110 are generally uniform in the Y direction. As a result, in some embodiments, the mask 128 can be shifted slightly, or misaligned, along the Y axis without significantly affecting the ultimate shape of the transistors. Similarly, because mask 128 is generally uniform in the X direction, some misalignment of the mask 128 in the X direction may be acceptable. Increasing the alignment margin is believed to increase yield and lower costs.

Figure 8:
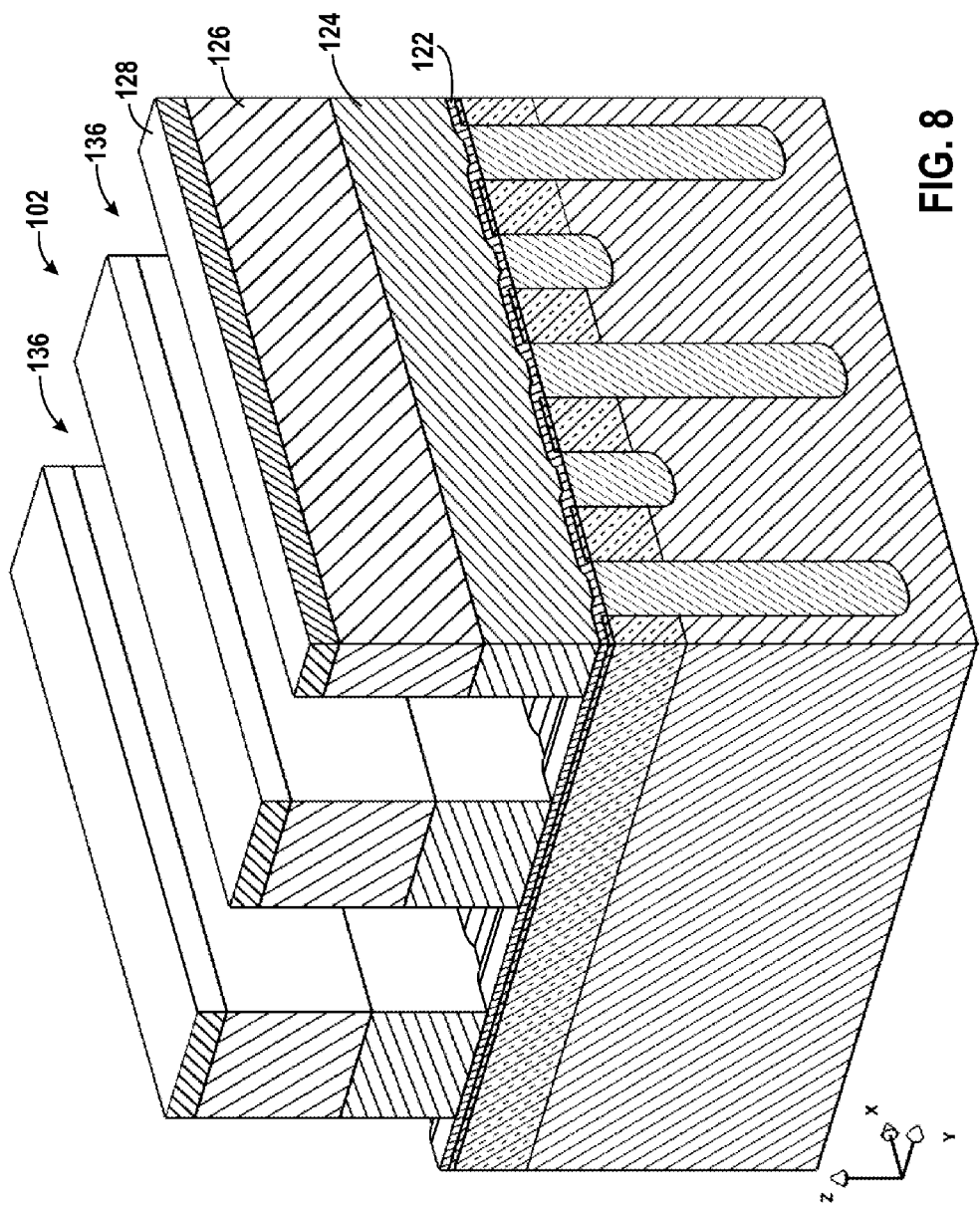

Next, precursor trenches 136 may be formed, as illustrated by FIG. 8. The precursor trenches 136 are formed by etching the regions of the substrate 102 not protected by the fin mask 128. Thus, the shape of the precursor trenches 136 may be generally complementary to the shape of the fin mask 128. The etch may be an anisotropic-plasma etch, and it may remove a substantial portion or all of the upper-sacrificial region 126 and the lower-sacrificial region 124 under the exposed regions. The etch may stop on or near the stop region 122. In some embodiments, a change in the chemical composition of product gases during the etch may signal when the etch has reached the stop region 122, or the etch may be timed.

Figure 9:
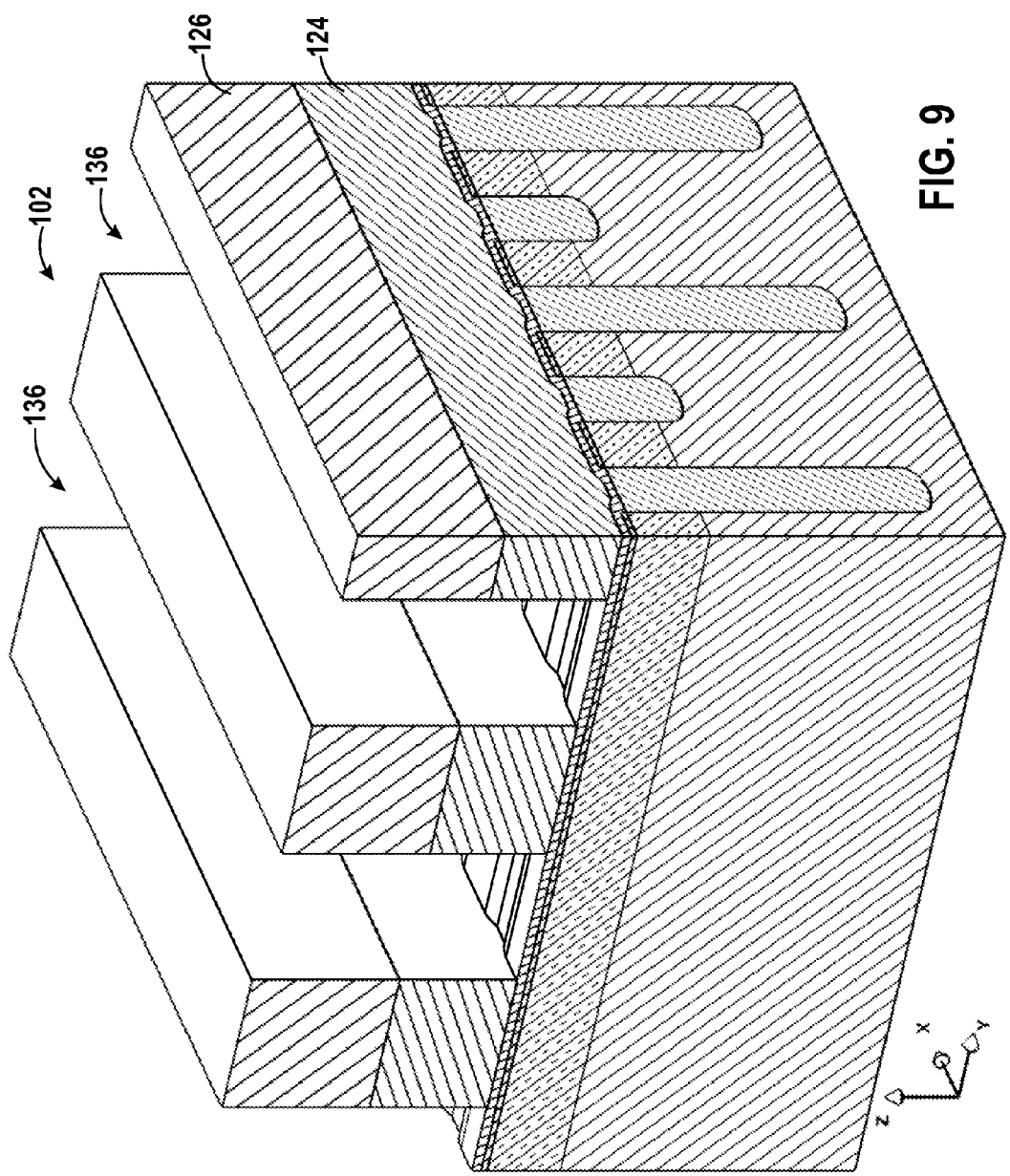

After forming in the precursor trenches, the fin mask 128 may be removed, as illustrated by FIG. 9. The fin mask 128 may be removed with a variety of techniques, including exposing the fin mask 128 to oxygen in a furnace or a plasma etch chamber.

Figure 10:
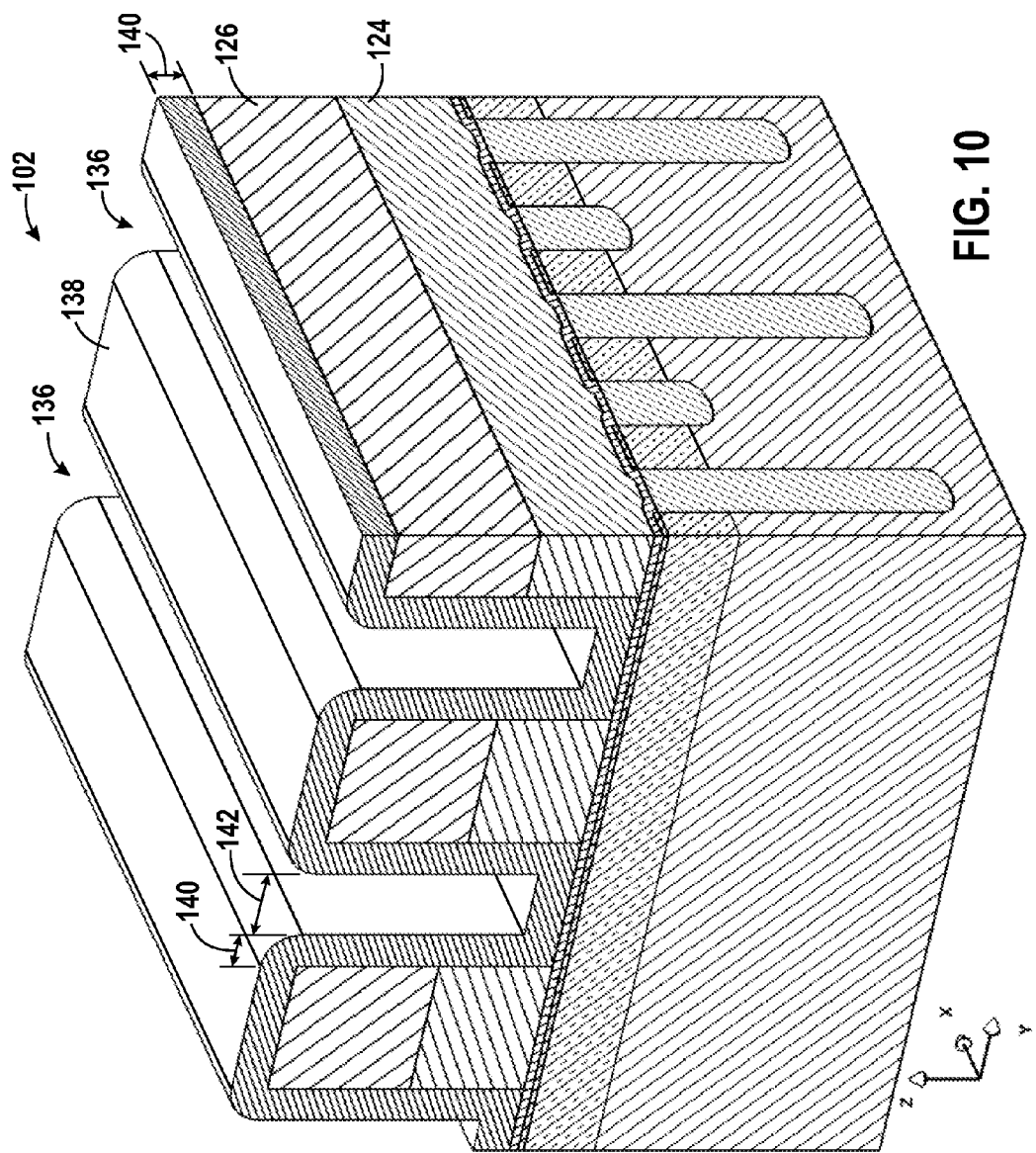

Next, a spacer 138 may be formed, as illustrated by FIG. 10. The illustrated spacer 138 is a generally conformal (e.g., a material with a generally uniform thickness over horizontal and vertical structures when applied) oxide deposited on the substrate 102. In some embodiments, the spacer 138 may be the same material as the upper-sacrificial region 126, but a different material from the lower-sacrificial region 124. The spacer 138 may have a thickness 140 generally greater than or equal to $\frac{1}{16}$ F, $\frac{1}{8}$ F, or $\frac{1}{4}$ F. The spacer 138 narrows a width 142 of the precursor trenches 136 to a width that is generally smaller than or equal to 1 F, $\frac{3}{4}$ F, or $\frac{1}{2}$ F. As explained below, this narrower width 142 may generally define the width of subsequently-formed fins.

Figure 11:
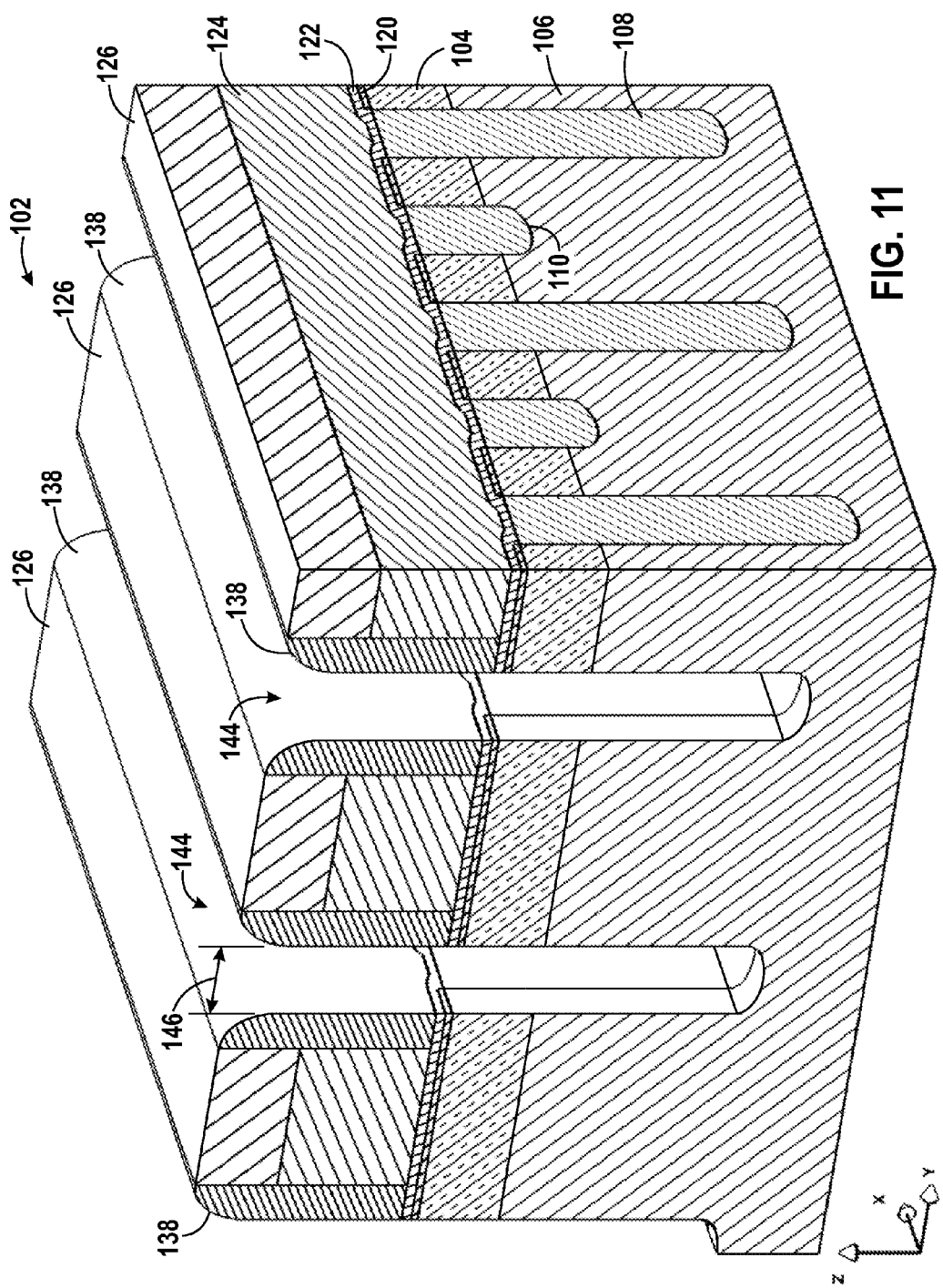

After forming the spacer 138, the substrate 102 may be etched, as illustrated by FIG. 11. The etch may be a generally anisotropic-plasma etch along the Z axis, resulting in removal of spacer material 138 from horizontal surfaces. For example, both the portion of the sacrificial region 126 in the bottom of the precursor trenches 136 and the portion of the spacer 138 above the upper-sacrificial region 126. Removing this material may form sidewall spacers that may further act as a mask as the etch progresses to form inter-row trenches 144. The etch may penetrate the stop region 122, the buffer region 120, the upper-doped region 104, and the lowered-doped region 106. In some embodiments, the etch may be deeper than the shallow trenches 110 but not as deep as the deep-isolation trenches 108. The etch may define generally straight and generally parallel inter-row trenches 144 that have a generally uniform cross-section over a substantial distance in the X direction, e.g., a distance greater than five transistors. The inter-row trenches 144 may have a width 146 that is generally equal to or less than 1 F, $\frac{3}{4}$ F, or $\frac{1}{2}$ F. In some embodiments, the inter-row trenches 144 may be between 1000 Å and 10,000 Å deep, e.g., between 2000 Å and 5000 Å. During subsequent steps, the inter-row trenches 144 may generally define the shape and the position of a dielectric disposed between adjacent rows of transistors.

Figure 12:
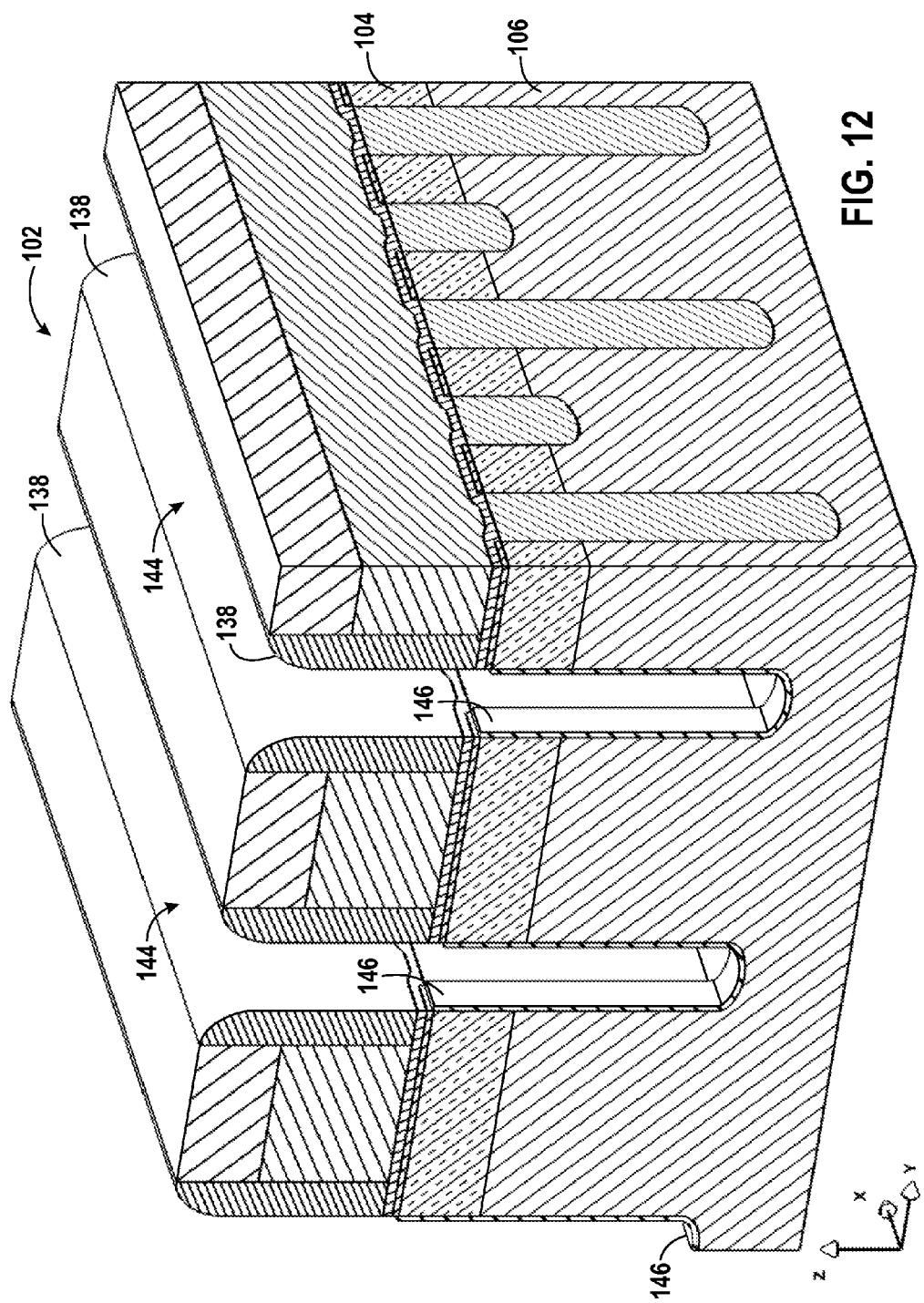

Next, an outer liner 146 may be formed in the inter-row trenches 144, as illustrated by FIG. 12. The illustrated outer liner 146 may be an oxide grown on exposed portions of the upper-doped region 104 and the lower-doped region 106. In other embodiments, the outer liner 146 may be deposited by methods know in the art. The liner may have a thickness less than 150 Å, e.g., 20 to 70 Å, and in some embodiments, it may protect the upper-doped region 104 and the lower-doped region 106 from stress-induced defects.

Figure 13:
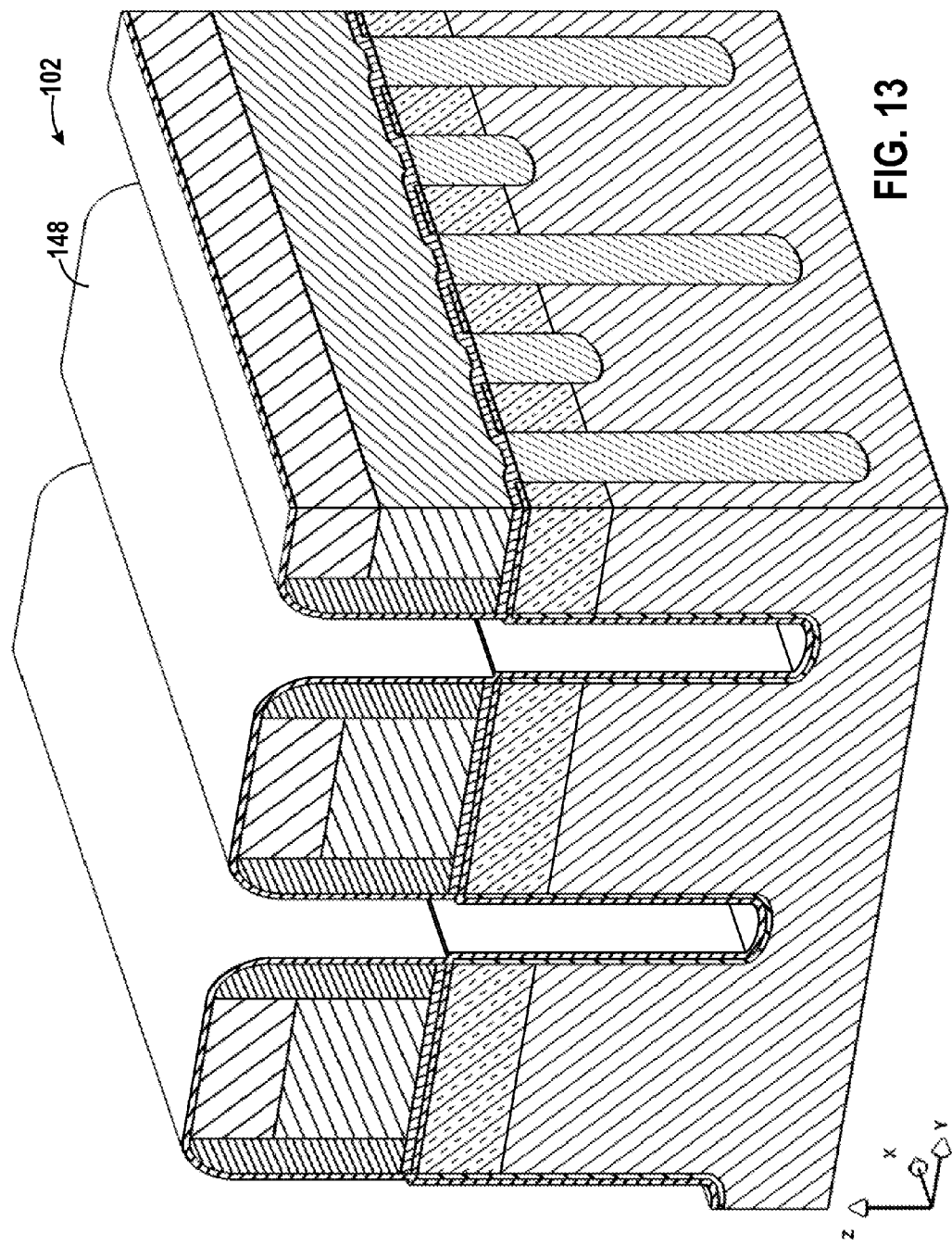

As illustrated by FIG. 13, an inner liner 148 may be formed on the substrate 102. The inner liner 148 may be a nitride layer deposited on the substrate 102. The inner liner 148 may have a thickness less than 200 Å, e.g., between 30 Å and 100 Å. In some embodiments, another liner may be formed on the inner liner 148, e.g., a TEOS liner having a thickness between 100 Å and 300 Å.

Figure 14:
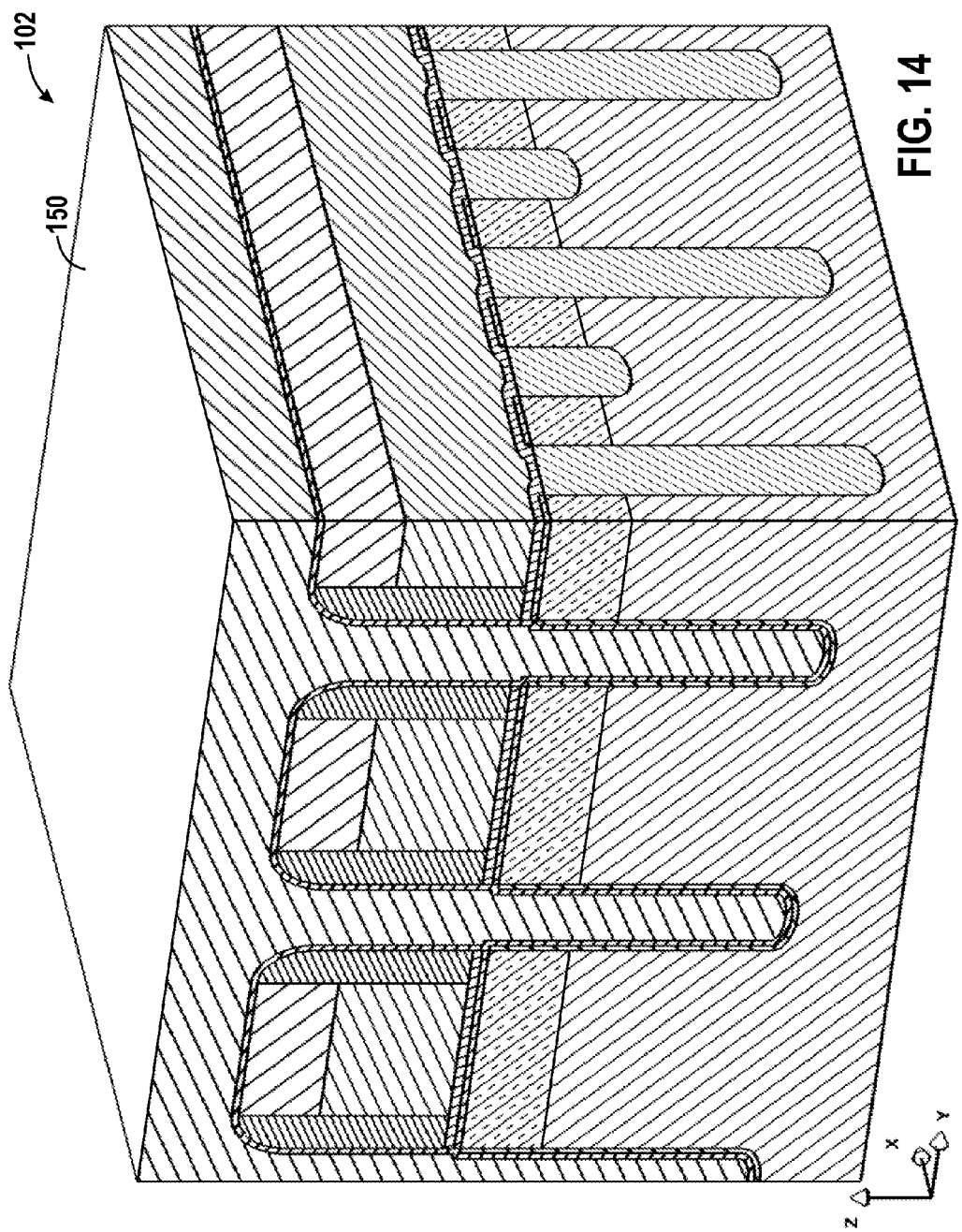

Next, an inter-row dielectric 150 may be formed on the substrate 102, as illustrated by FIG. 14. The inter-row dielectric 150 may be made from or include a variety of dielectric materials, such as a spun on dielectric (SOD). In some embodiments, a SOD inter-row dielectric 150 may be densified by heating the substrate 102 to drive volatile compounds from the inter-row dielectric 150. During densification, one or more of the liners 146 or 148 may ease film stresses from the shrinking inter-row dielectric 150, stresses that could otherwise cause slip, or misalignment of the crystal planes, in the substrate 102.

Figure 15:
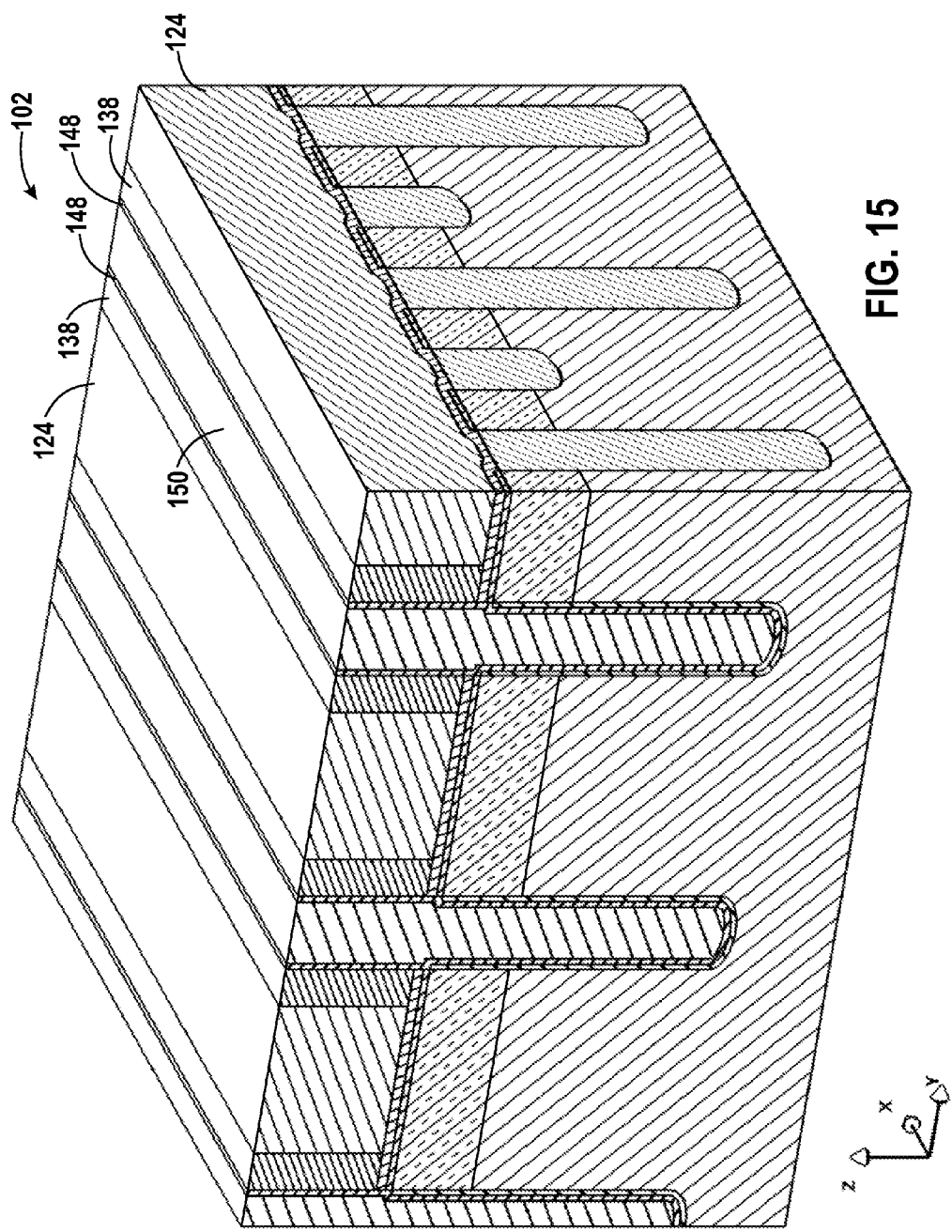
Figure 16:
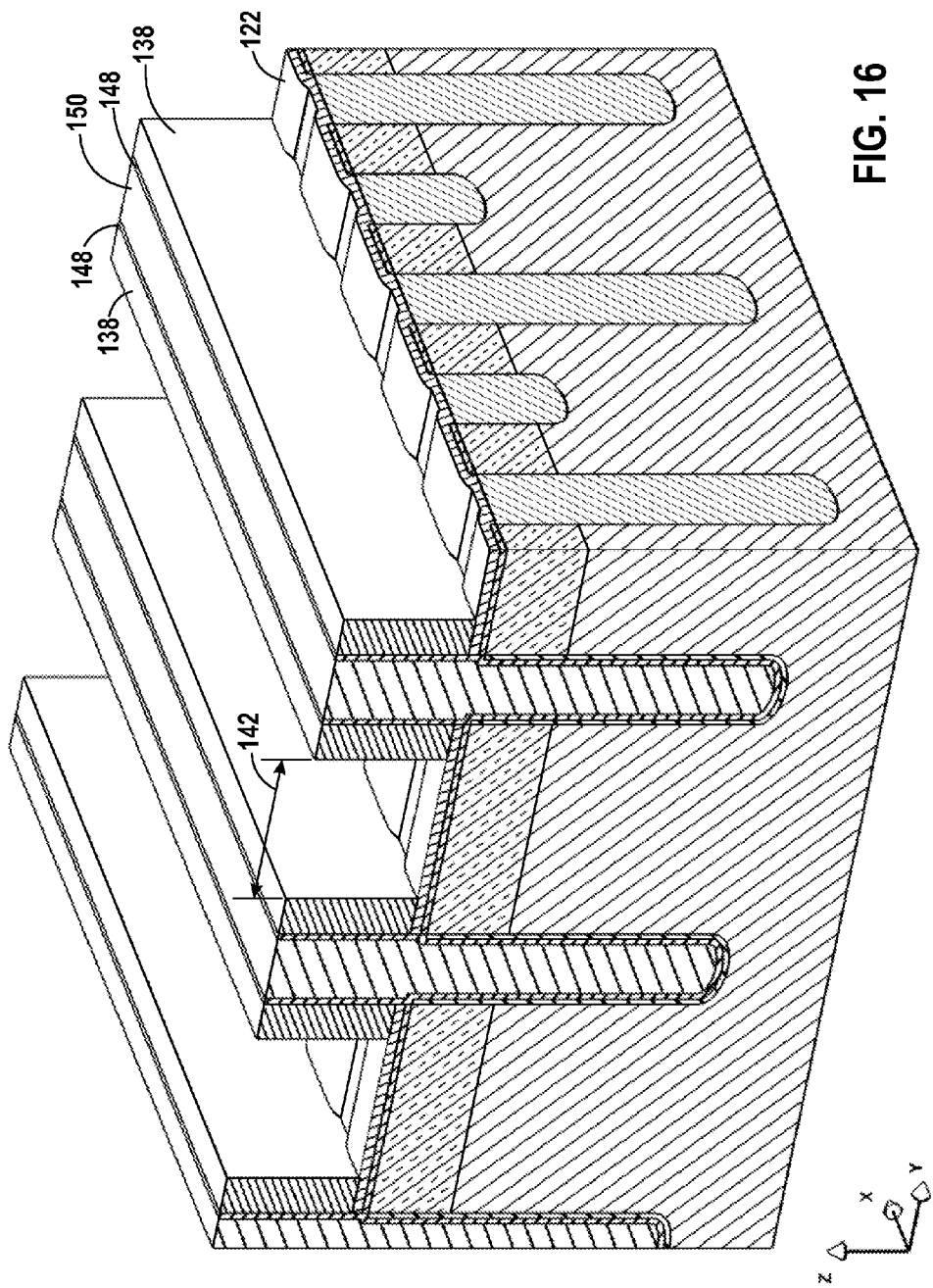

As illustrated by FIG. 15, a top portion of the substrate 102 may be removed after formation of the inter-row dielectric 150. In some embodiments, the top portion is removed with a CMP process that stops on or in the lower-sacrificial region 124. The CMP process may be end-pointed by phenomena that arise during the transition into the lower-sacrificial region 124. Examples of such phenomena include a change in the optical properties of the substrate 102 (e.g., color or reflectivity), a change in the chemical properties of waste materials (e.g., compounds in waste slurry), or a change in the mechanical properties of the substrate 102 (e.g., sliding friction). Alternatively, or additionally, the top portion of the substrate 102 may be removed with an etch that stops on or in the lower-sacrificial region 124.

This step exposes the lower-sacrificial region 124 for removal, so that a sidewall spacer can be formed in its place, as explained below. In some embodiments, the lower-sacrificial region 124 is removed with a wet etch that is generally selective to the material from which the lower-sacrificial region 124 is made, e.g., a wet etch that is generally selective to polysilicon, such as a tetramethylammonium hydroxide (TMAH) etch. The space left by removing the lower-sacrificial region 124 may have a width 152 that generally corresponds with (e.g., is generally equal or proportional to) the width 132 of the masked region of the fin mask 128 (FIG. 7). The vertical, exposed surfaces of the spacer 138 may provide a surface upon which sidewall spacers may be formed to position and shape gates and fins.

Figure 17:
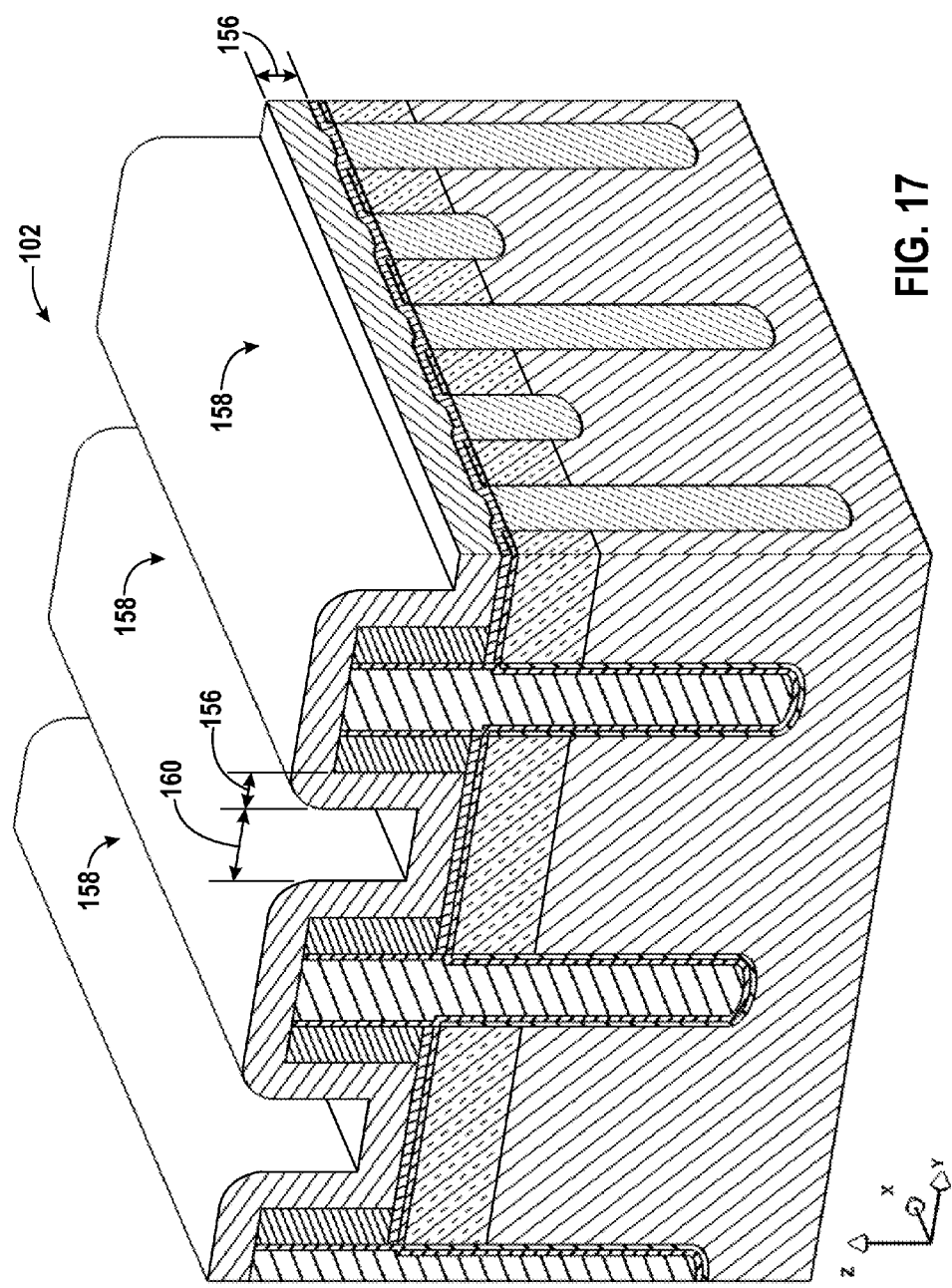

Next, another spacer 154 may be formed on the substrate 102, as illustrated by FIG. 17. This spacer 154 may be made of a different material from the earlier spacer 138, the inner liner 148, the inter-row dielectric 150, and the stop region 122. In some embodiments, the second spacer 154 is made of the same material as the lower-sacrificial 124, e.g., polysilicon. The spacer 154 may be a generally conformal film deposited on the substrate 102 to a thickness 156 between 100 Å and 1000 Å, e.g., between 200 Å and 600 Å. In some embodiments, the thickness 156 may be greater than, less than, or generally equal to ⅛ F or ¼ F, and the spacer 154 may define a gap 158 having a width 160 that is generally less than or equal to ¼ F, ½ F, or 1 F. As explained below, the thickness 156 may generally define the width of subsequently-formed gates, and the width 160 may generally define the width of subsequently-formed fins.

Figure 18:
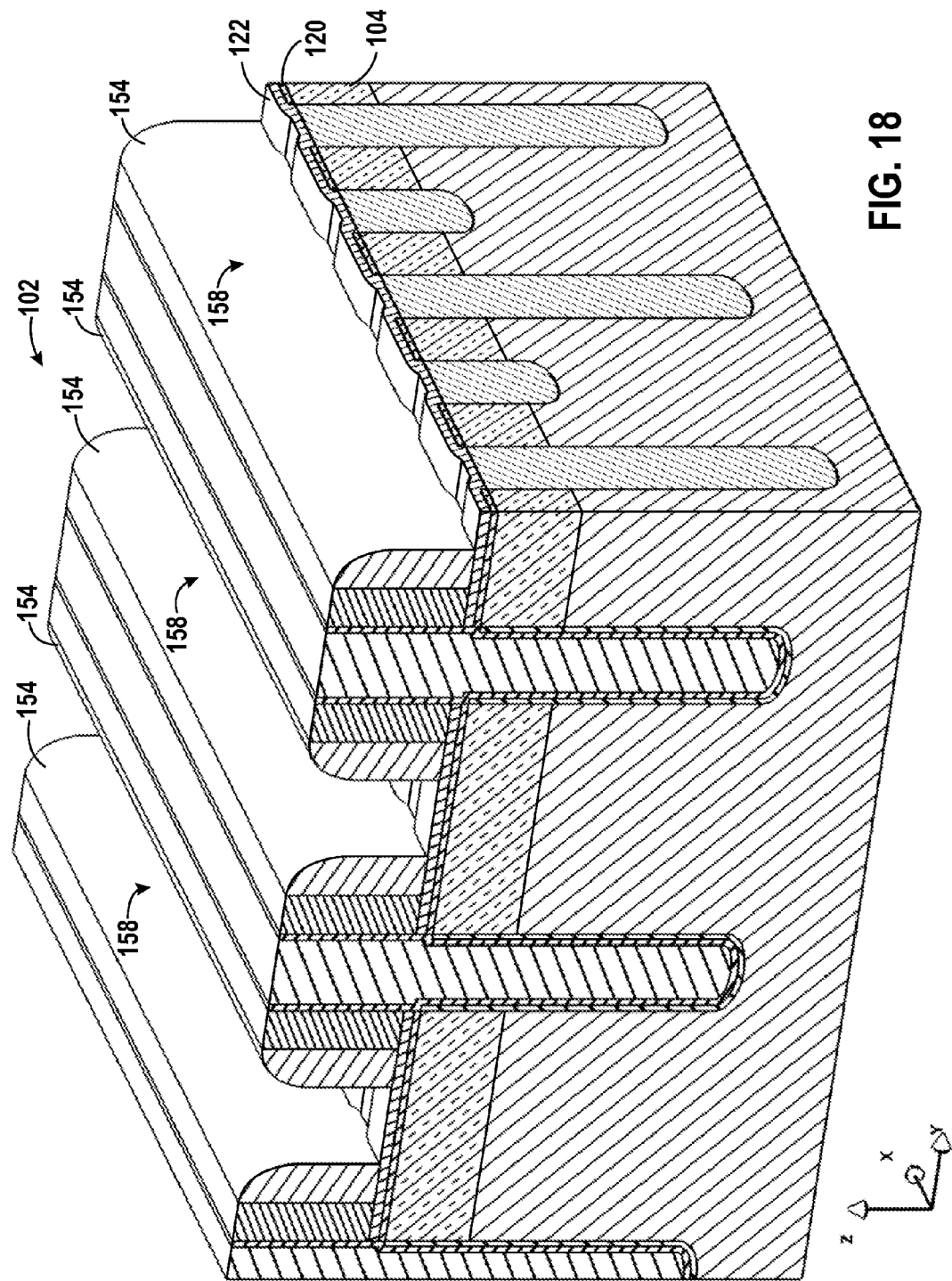

As illustrated by FIG. 18, the second spacer 154 may be anisotropically etched to form sidewall spacers. The etch may be performed in a plasma etch chamber, and it may generally remove a substantial portion or all of the spacer 154 from horizontal surfaces while leaving a substantial portion of the spacer 154 disposed on vertical surfaces. The etch may stop on or in the stop region 122, the buffer region 120, or the upper-doped region 104.

Figure 19:
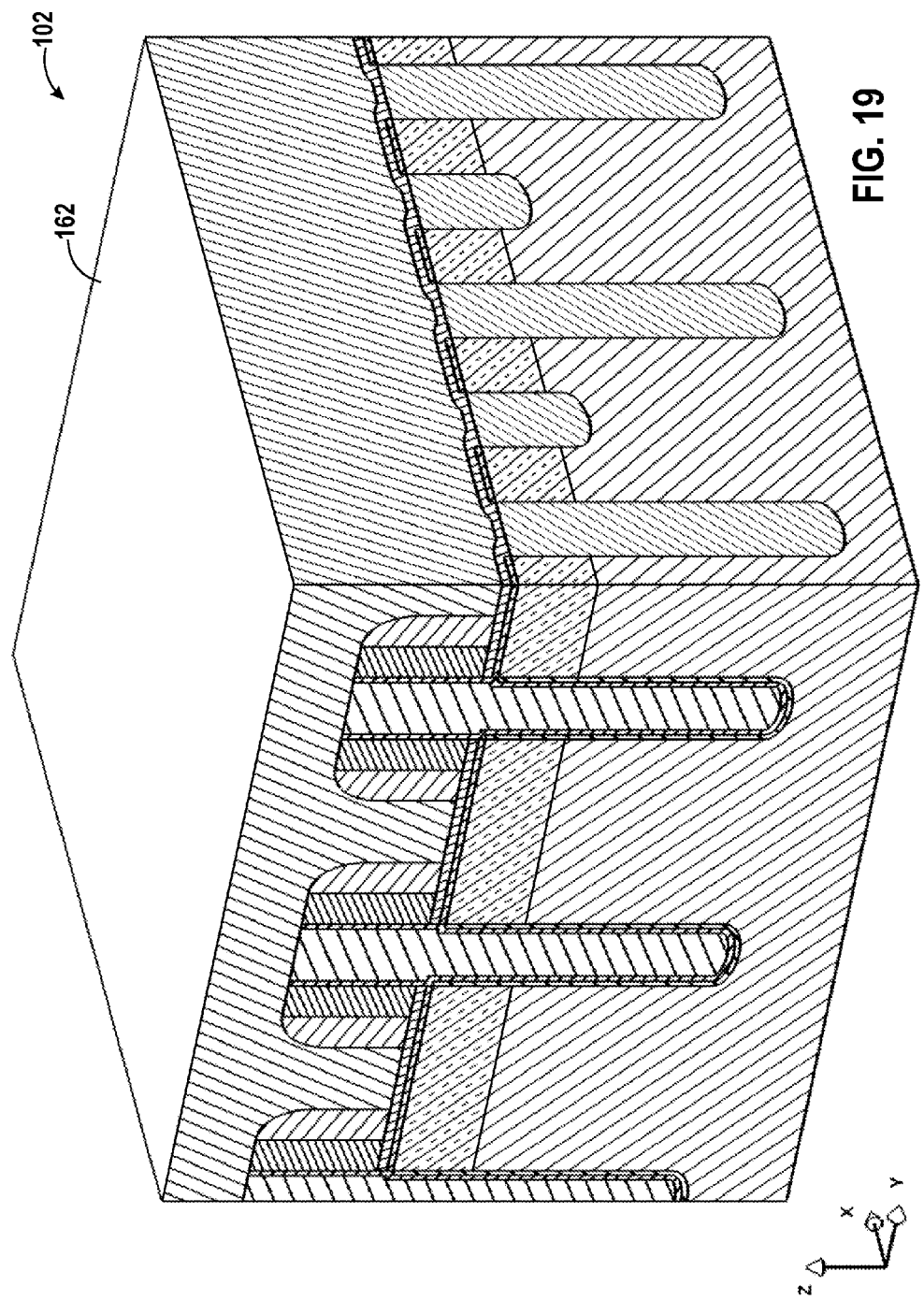

After etching the spacer 154, another sacrificial region 162 may be formed on the substrate 102, as illustrated by FIG. 19. The illustrated sacrificial region 162 may be an oxide that is deposited to a thickness between 100 Å and 1000 Å, e.g., between 200 Å and 600 Å. The sacrificial region 162 may partially, substantially, or entirely fill the voids 158. In some embodiments, the sacrificial region 162 may be a different material from the second spacer 154 to facilitate selective removal of the spacers formed by the second spacer 154.

Figure 20:
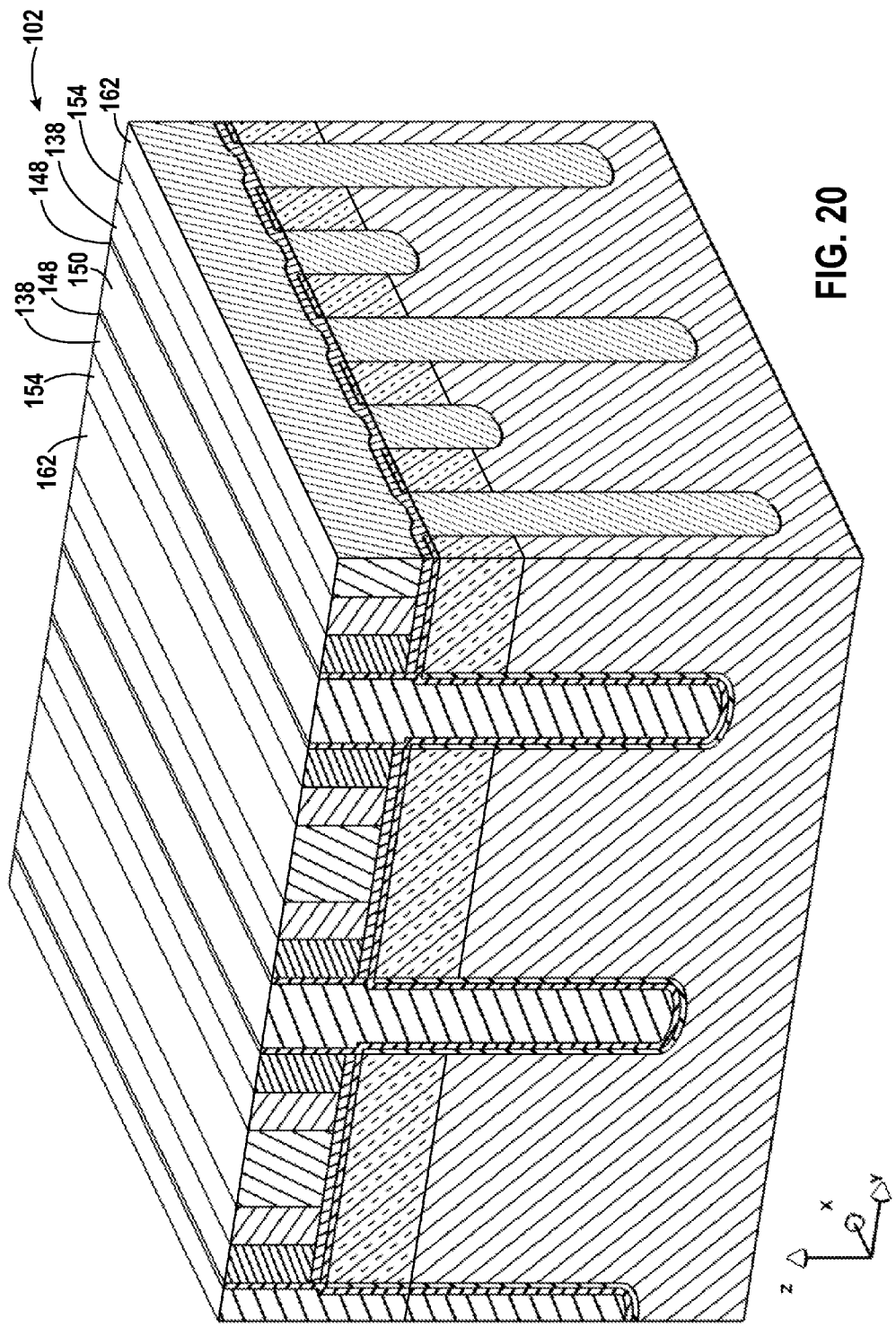

Next, a top portion of the substrate 102 may be removed, as illustrated by FIG. 20. The top portion may be removed with a variety of processes, including an etch or a CMP. In some embodiments, the substrate 102 is polished until a top portion of the sidewall spacers formed from the second spacer 154 are exposed.

Figure 21:
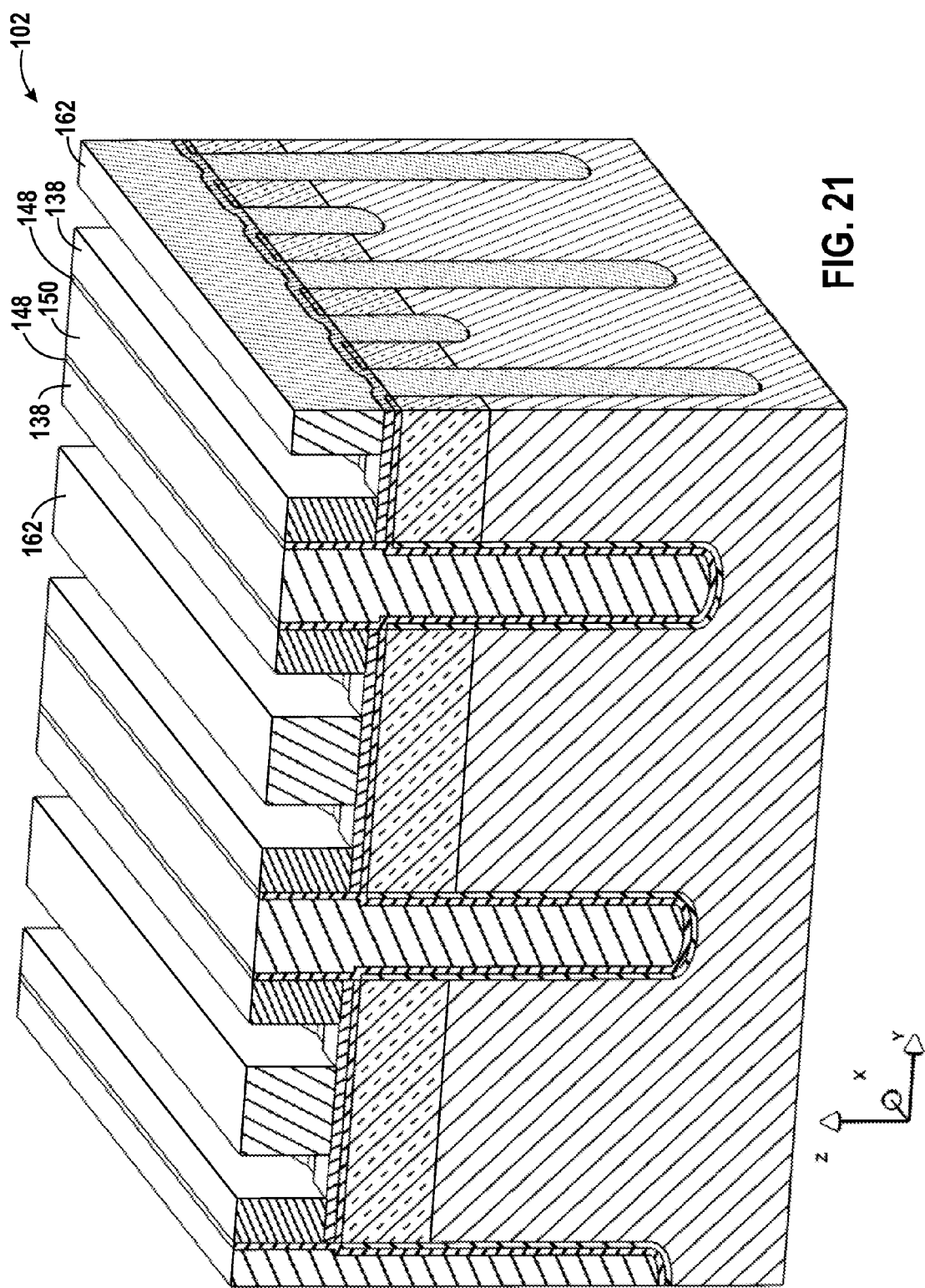

As illustrated by FIG. 21, the second spacer 154 is removed from the substrate 102. The second spacer 154 may be removed with an etch, e.g., a wet etch that is generally selective to the material from which the second spacer 154 is made. For example, in embodiments in which the second spacer 154 is made from polysilicon, the second spacer 154 may be removed with a TMAH wet etch.

Figure 22:
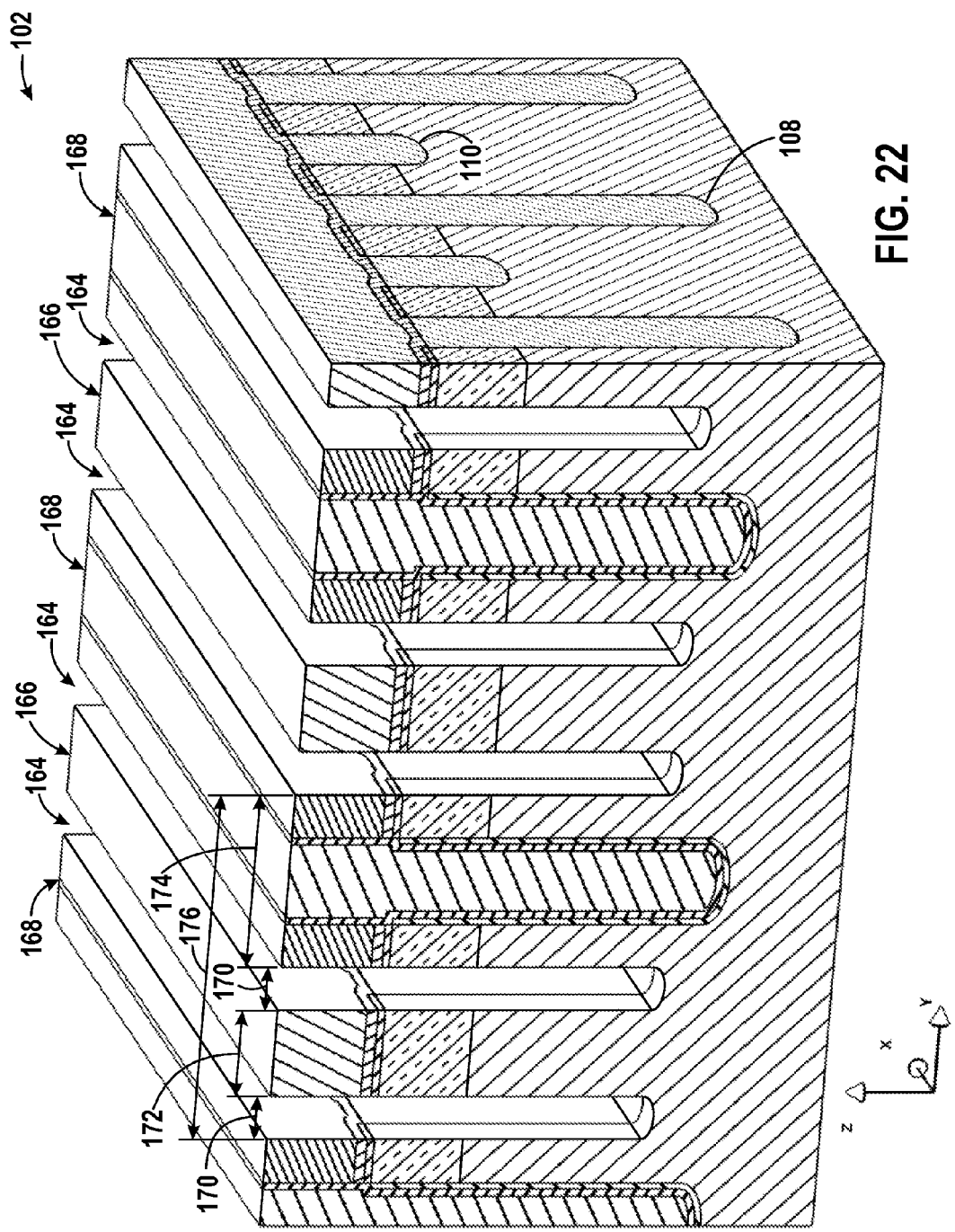

Next, an etch may remove material from the portions of the substrate 102 exposed by removing the second spacer 154, as illustrated by FIG. 22. The etch may form gate trenches 164, fin rows 166, and insulating projections 168. The gate trenches 164 may each be disposed between each of the fin rows 166 and the insulating projections 168. The substrate 102 may include two-gate trenches 164 for each fin row 166 and each insulating projection 168. The illustrated gate trenches 164 are disposed between the fin rows 166 and the insulating projections 168. In the illustrated embodiment, the etch does not remove material from the inter-row dielectric 150, and the insulating projections include the inter-row dielectric 150 sandwiched between two portions of the upper-doped region 104 and the lower-doped region 106. In other embodiments, though, the etch may consume these portions of the upper-doped region 104 and the lower-doped region 106, and material from the inter-row dielectric 150 may define part of the gate trenches 164.

The features 164, 166, and 168 may be formed with a generally anisotropic etch that etches between 500 Å and 4000 Å into the substrate 102, e.g., a between 1300 Å to 2500 Å. The gate trenches 164, the fin rows 166, and the insulating projections 168 may be generally straight and have a generally uniform cross-sectional shape through a substantial distance in the X direction, e.g., through a distance greater than five transistors. The structures 164, 166, and 168 may be generally parallel to one another and generally perpendicular to the shallow trenches 110 and the deep-isolation trenches 108. The gate trenches 164, the fin rows 166, and the insulating projections 168 may have a widths 170, 172, and 174, respectively, that are generally equal to or less than ¼ F, ½ F, or 1 F. In some embodiments, the pattern of the gate trenches 164, the fin rows 166, and the insulating projections 168 may repeat with a period 176 generally equal to or less than 3 F, 2 F, or 3/2 F.

Figure 23:
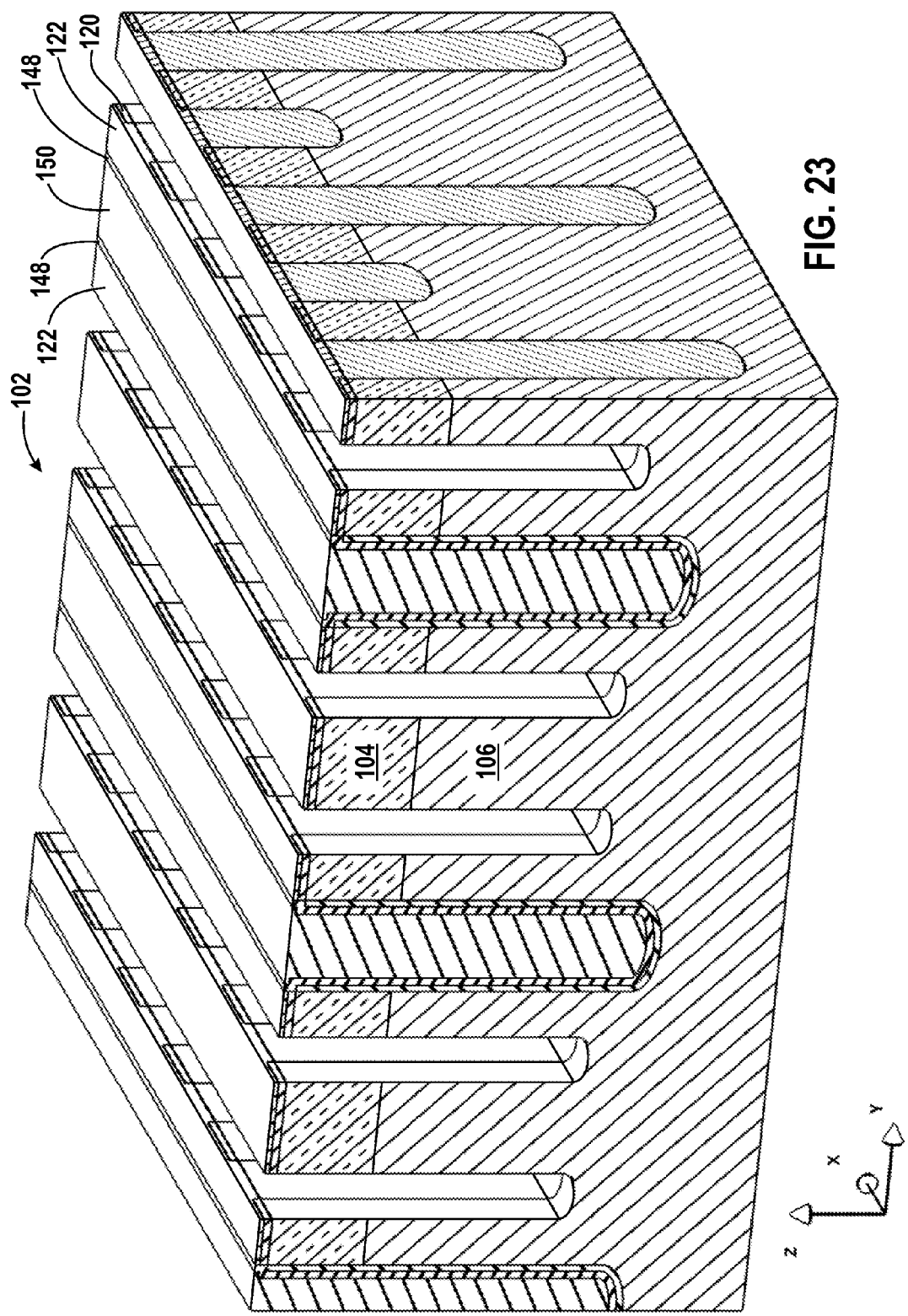

Next, the substrate 102 is planarized with CMP, as illustrated by FIG. 23. In some embodiments, CMP may remove the remaining portion of the sacrificial region 162 and the liner 138, and in some embodiments, it may also remove a top portion of the inter-row dielectric 150, the inner liner 148, and the stop region 122. The planarization may stop on or near the stop region 122. After planarizing, in some embodiments, the substrate 102 may be cleaned to remove CMP-slurry residue. In some embodiments, the substrate 102 may be cleaned without exposing the substrate 102 to hydrofluoric acid, which could create pits by preferentially etching certain crystal orientations of the upper-doped region 104 and the lower-doped region 106.

Figure 24:
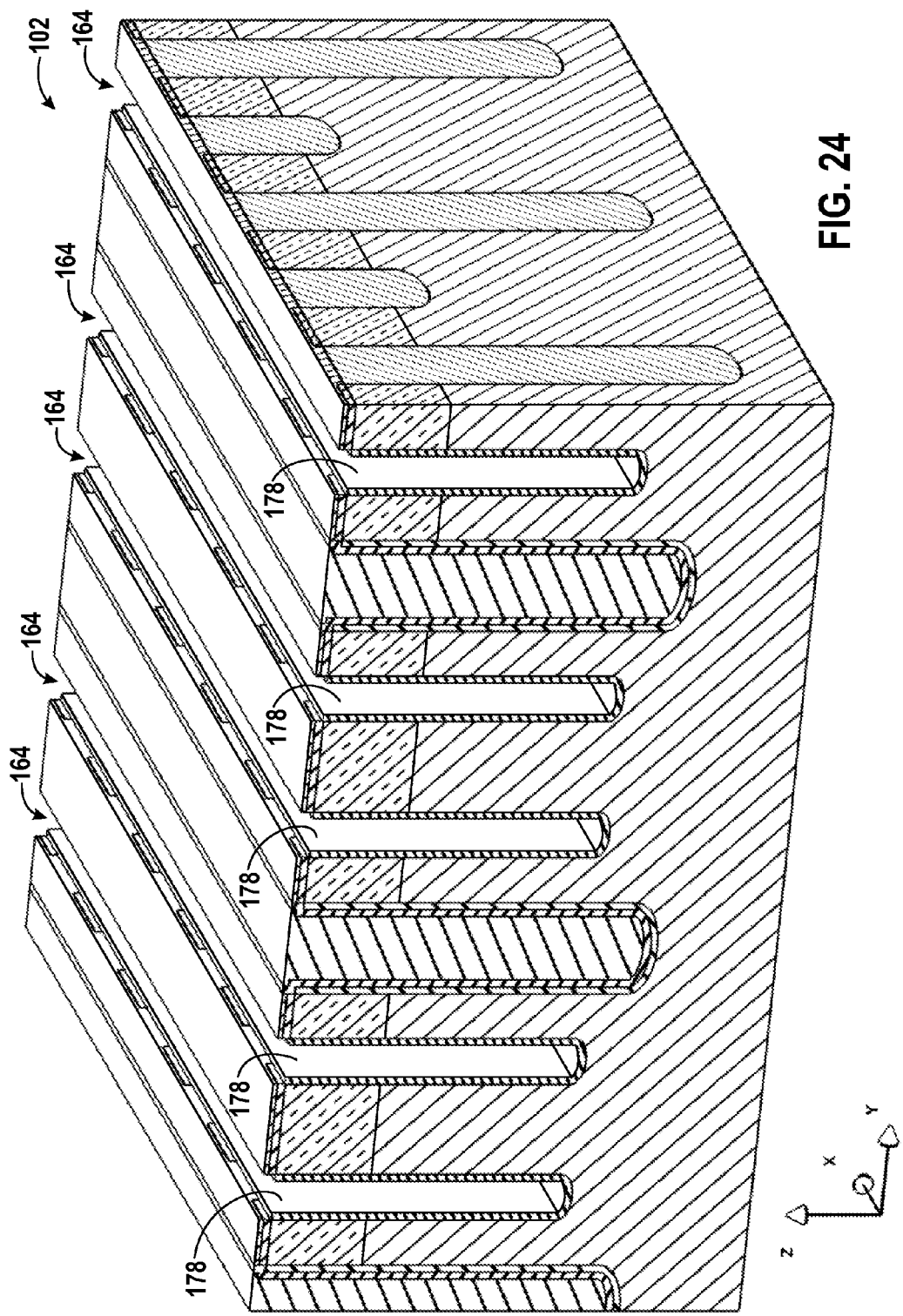

As illustrated by FIG. 24, a gate dielectric 178 may be formed in the gate trenches 164. In some embodiments, the gate dielectric 178 may be deposited with chemical vapor deposition (CVD) or atomic layer deposition (ALD), or the gate dielectric 178 may be grown by, for example, exposing the substrate 102 to oxygen. The gate dielectric 178 may be made of a variety of dielectric materials, such as oxide (e.g., silicon dioxide), oxynitride, or high-dielectric constant materials like hafnium dioxide, zirconium dioxide, and titanium dioxide. In some embodiments, the gate dielectric 178 may have a thickness of less than 300 Å, e.g., between 30 Å and 150 Å.

Figure 25:
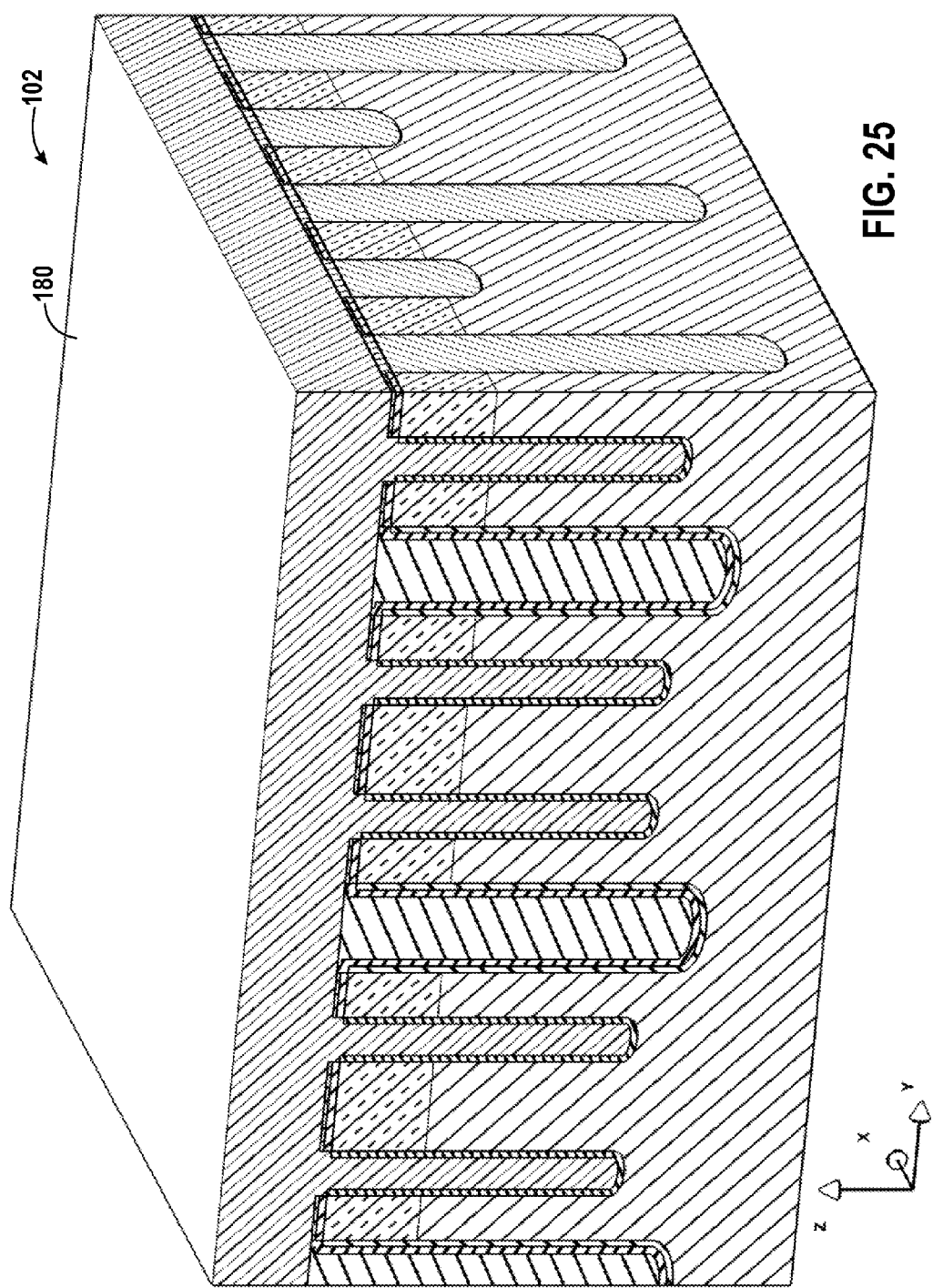

Next, a gate material 180 may be formed on the substrate 102, as illustrated by FIG. 25. The gate material may be one or more of a variety of conductive materials, such as doped polysilicon, tungsten, titanium, titanium nitride, or other appropriate materials, and it may be formed with a variety of processes, such as physical-vapor deposition (PVD) or CVD.

Figure 26:
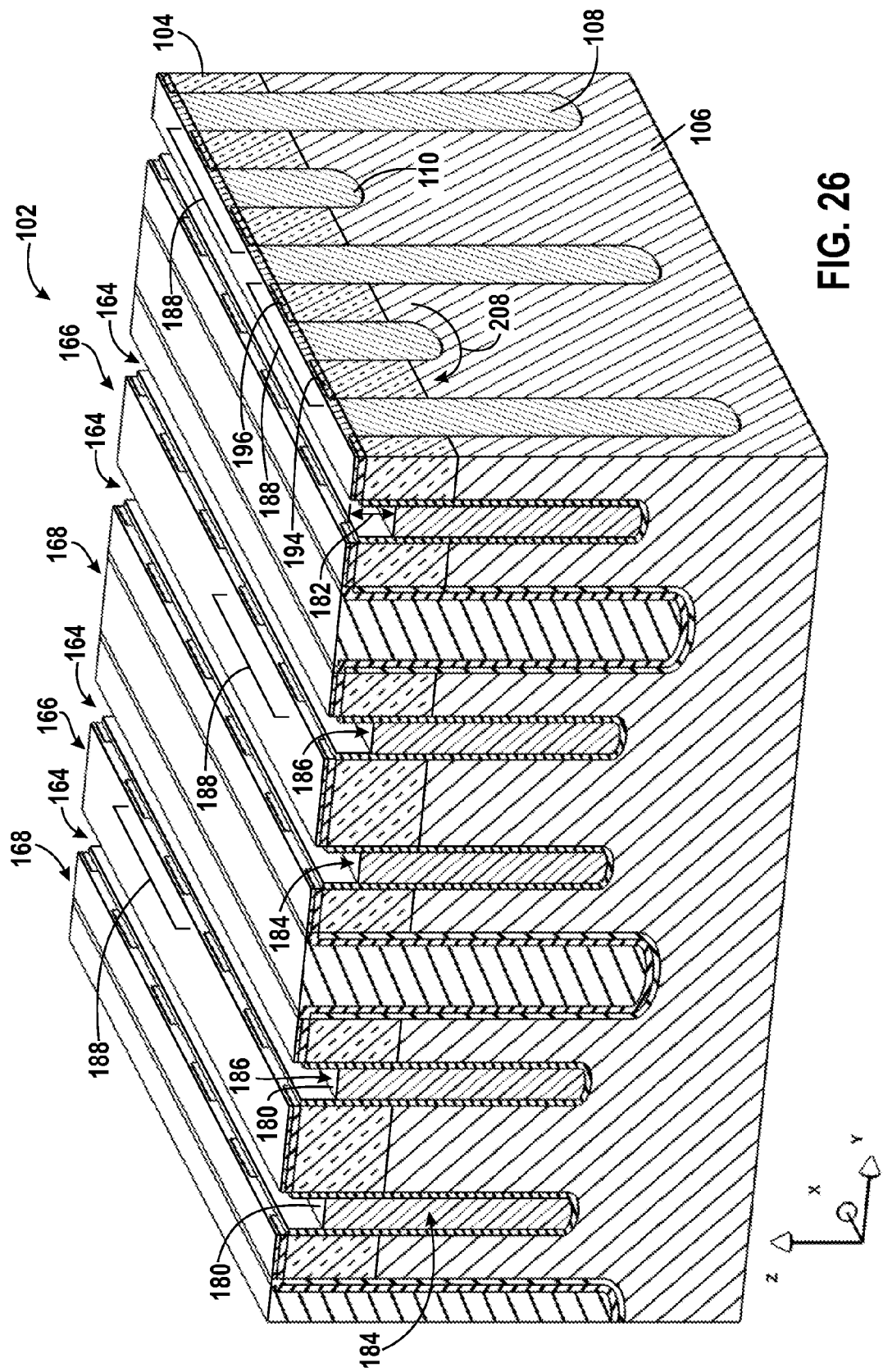

After forming the gate material 180, a top portion of the gate material 180 may be removed from the substrate 102, as illustrated by FIG. 26. The gate material 180 may be removed with a variety of processes, such as CMP, plasma etching, wet etching, or combinations thereof. In some embodiments, the gate material 180 is recessed by a distance 182 that is generally less than or equal to 1000 Å, e.g., between 200 Å and 500 Å. The distance 182 may allow the top of the gate material 180 to be above the bottom of the upper-doped region 104, i.e., the gate material 180 may at least partially overlap the upper-doped region 104. In one embodiment, recessing the gate material 180 into the gate trenches 164 forms gates 184 and 186. The gates 184 and 186 may be disposed on opposite sides of the fin rows 166, and the illustrated gates 184 and 186 may be electrically isolated from an adjacent gate 184 or 186 by the insulating projections 168.

The illustrated gates 184 and 186 may be less likely to short to one another than gates in some conventional designs. In one embodiment, a portion, e.g., approximately half, of the gate trenches 164 are defined by the insulating projections 168, thereby forming trenches 164 that are insulated in at least one direction, e.g., the direction of the closest, adjacent fin row 166. Thus, the illustrated gates 184 and 186 are formed by recessing the gate material 180 into the pre-isolated gate trenches 164. The gates 184 and 186 of this embodiment are believed to be less likely to short than gates of conventional designs, which often include gates that are isolated after the shape of the gates is generally defined. In other words, in some conventional designs, the gate determines, at least in part, the shape of the inter-gate dielectric, whereas in the illustrated embodiment, the shape of the insulating structure between the gates, i.e., the insulating projections 168, at least partially determines the shape of the gates 184 and 186. This is believed to increase the efficacy of the insulating projections 168 in some embodiments, because the insulating projections 168 obstruct the paths between gates 184 and 186 before the gates 184 and 186 are formed.

Each of the illustrated fin rows 166 may cooperate with the adjacent gates 184 and 186 to form a plurality of transistors 188. The shape of part of the transistors 188 is illustrated by FIG. 27, which illustrates the shape of the semiconductive portion of a single transistor 188. The illustrated transistor 188 includes a fin 190 rising from a base 192. The illustrated fin 190 includes a distal portion with two legs 194 and 196 separated by a generally U-shaped void 198. In this embodiment, the void 198 is formed by the shallow trench 110, and the void 198 extends below the depth of the upper-doped region 104. The illustrated legs 194 and 196 include both the upper-doped region 104 and a top portion of the lower-doped region 106. The illustrated fin 190 also includes two opposing sides 200 and 202 that may be generally parallel to one another, generally angled with respect to one another, or generally curved with respect to one another. Edges 204 and 206 of the fin 188 may be generally perpendicular to the sides 200 and 202 and generally parallel to one another, generally angled with respect to one another, or generally curved with respect to one another.

In operation, the two legs 194 and 196 may function as a source and a drain, and the transistor 188 may selectively control the flow of current between the source and the drain according to a voltage of the gates 184 and 186 (FIG. 26). When turned on, the illustrated transistor 188 establishes a generally vertical channel represented by arrow 208, illustrating current flow between the source and drain. The channel 208 may be established by electric fields emanating from the two gates 184 and 186. The gates 184 and 186 may be energized according to a variety of patterns: both gates 184 and 186 may be energized generally simultaneously; one gate 184 and 186 may be energized, but not the other; or the gates 184 and 186 may be energized independent of one another. In some embodiments, the gates 184 and 186 may partially or entirely circumscribe the fin rows 166, e.g., the gates 184 and 186 may connect at one or both ends of the fin rows 166. The illustrated transistors 188 may be referred to as dual-gate transistors or multi-gate transistors, as they have a gate 184 and 186 adjacent each side wall 200 and 202.

The previously described embodiment forms the structures extending in the X direction, i.e., the fin rows 166, the gates 184 and 186, and the insulating projections 168, with a single lithography step that is described with reference to FIG. 7. Other embodiments may form these structures 166, 184, and 186 with two or more lithography steps but fewer steps overall. An example of such a manufacturing process is illustrated by FIGS. 28 through 37. As explained below, this embodiment includes fewer process steps but one additional lithography step compared to the above-described embodiment.

Figure 28:
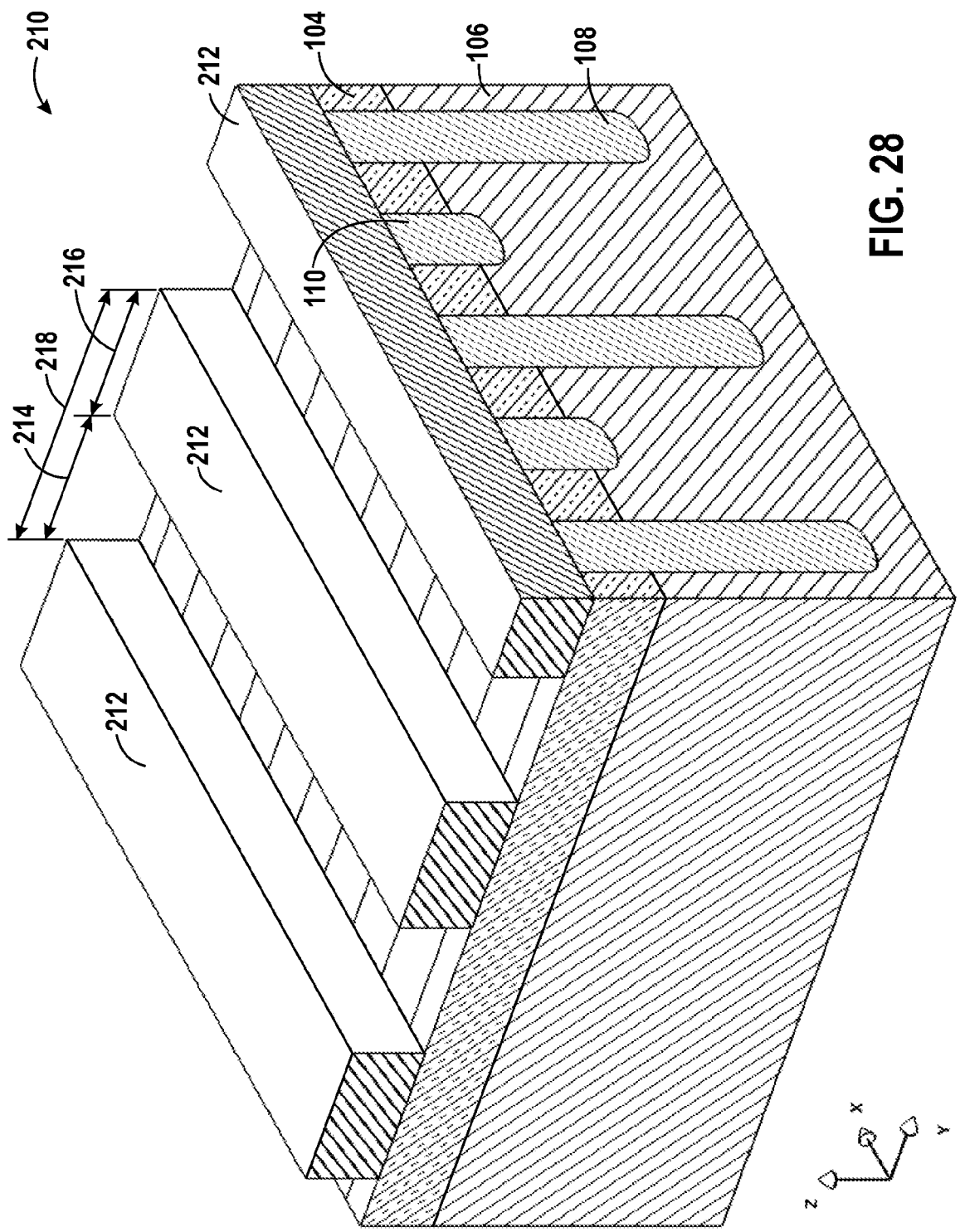

As illustrated by FIG. 28, this embodiment begins with providing a substrate 210. The substrate 210 may initially undergo the processes described above with reference to FIGS. 1 and 2. As a result, the substrate 210 may include an upper-doped region 104, a lower-doped region 106, deep-isolation trenches 108, and shallow trenches 110. On top of these features, a first-fin mask 212 may be formed. The first-fin mask 212 may be made of photoresist, or it may be a hard mask. The first-fin mask 212 may be patterned with any of the lithography systems described above or sub-lithographic techniques, such as resist reflow, mask undercutting, or double pitching via a sidewall spacer. In some embodiments, the first-fin mask 212 generally defines exposed regions with a width 214 and masked regions with a width 216. In certain embodiments, these widths 214 and 216 are generally equal and each generally equal to or less than 1 F. The first-fin mask 212 may repeat with a period 218 that is generally equal to or less than 2 F. The illustrated exposed regions and masked regions are generally straight, generally parallel to neighboring mask structures, and generally perpendicular to both the deep-isolation trenches 108 and the shallow trenches 110. The exposed regions and the masked regions of the first-fin mask 212 may have a generally uniform cross-section through a substantial distance in the X direction, e.g., a distance greater than five transistors.

Figure 29:
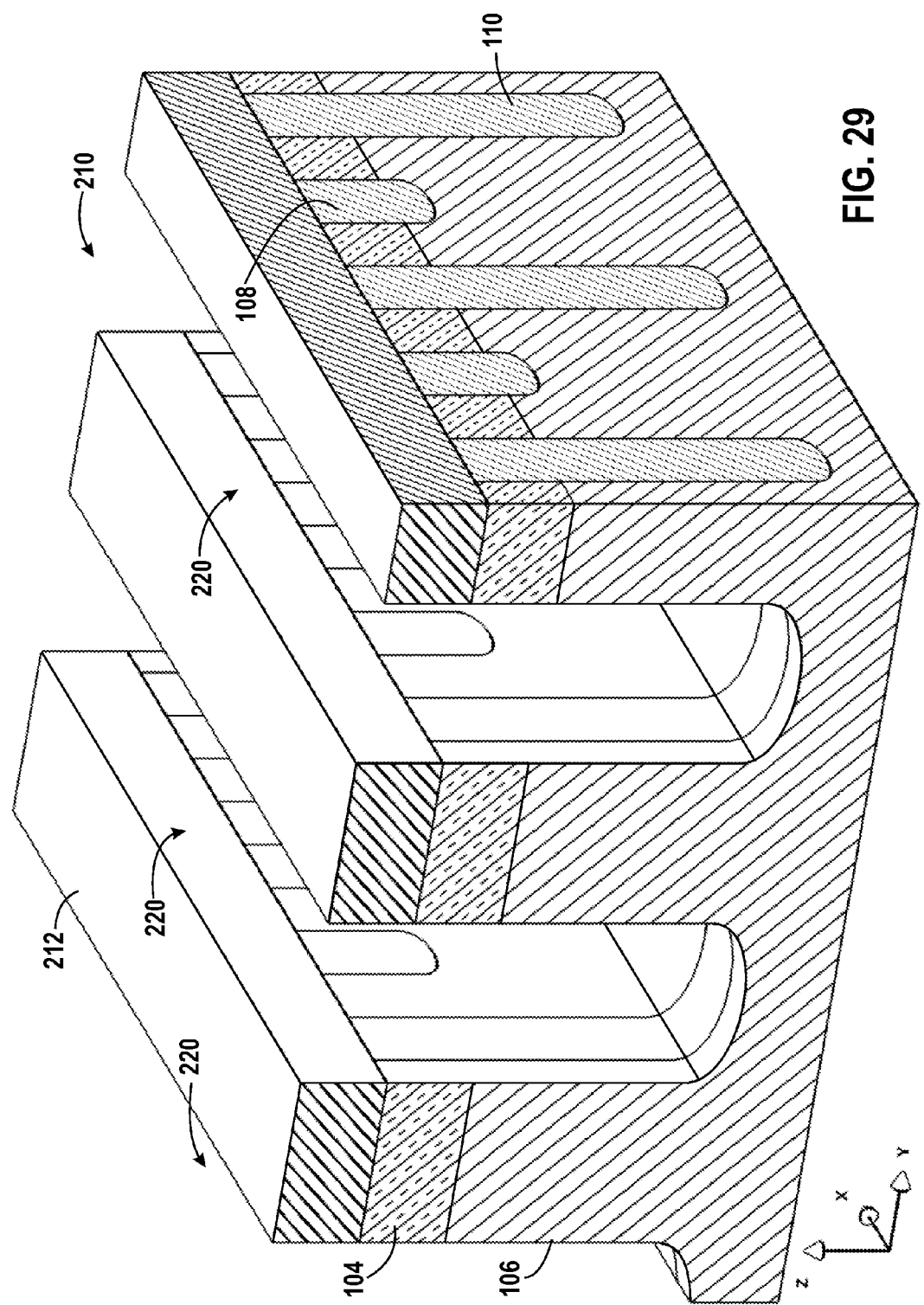

Next, inter-row trenches 220 are etched, as illustrated by FIG. 29. The inter-row trenches 220 may be etched with a generally anisotropic plasma etch, and they may extend a distance into the substrate 210 that is greater than the depth of the shallow trenches 108 but not as deep as the deep-isolation trenches 110. In other embodiments, the inter-row trenches 220 may be generally as deep as or deeper than the deep-isolation trenches 110. The bottom of the inter-row trenches 220 may be implanted with a field-isolation implant (not shown) to isolate subsequently-formed transistors.

Figure 30:
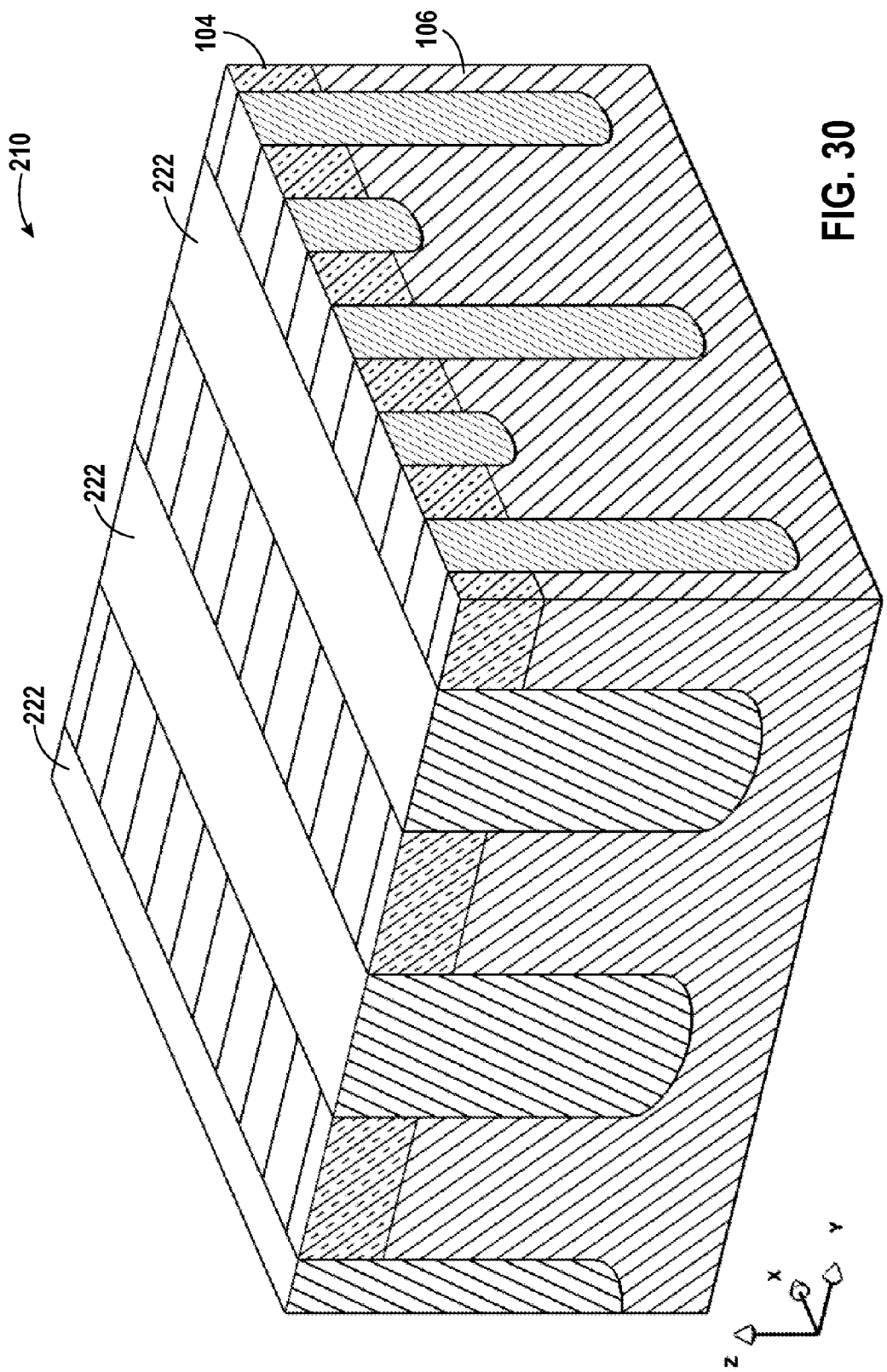

As illustrated by FIG. 30, after etching the inter-row trenches 220, the first-fin mask 212 may be removed, and an inter-row dielectric 222 may be formed in the inter-row trenches 220. In some embodiments, the inter-row dielectric 222 may be formed with CVD, ALD, spun-on dielectrics, or other appropriate processes and materials. The inter-row dielectric 222 may be an oxide, such as one of the oxides described above, and in some embodiments, it may include both a thin-oxide liner adjacent the upper-doped region 104 and the lower-doped region 106 and a nitride liner between the oxide liner and the rest of the inter-row dielectric 222. In some embodiments, the inter-row dielectric 222 is deposited with an overburden that is removed with CMP or an etch to generally planarize the surface of the substrate 210.

Figure 31:
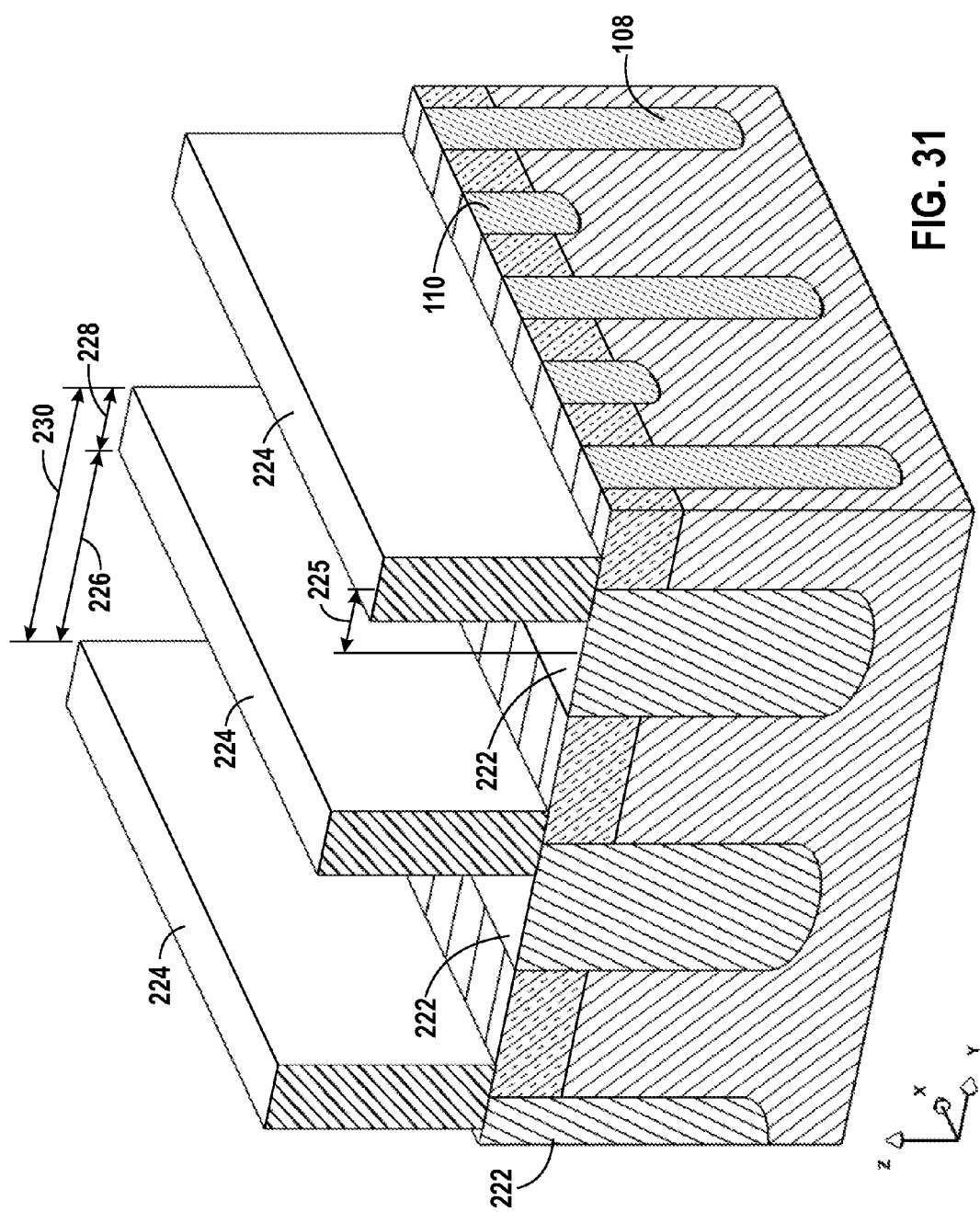

Next, as illustrated by FIG. 31, a second-fin mask 224 may be formed. The second-fin mask 224 may be misaligned with respect to the first-fin mask 212 by a distance 225 generally equal to one-half of the period 218 of the first-fin mask 212. For example, the midpoint of the masked regions of the first-fin mask 224 may be separated from the midpoint of the masked regions of the second-fin mask 212 by the distance 225. Additionally, the midpoint of the masked regions of the second-fin mask 224 may generally fall on or near the edge of the masked regions of the first-fin mask 212, as illustrated by the position of the second fin mask 224 relative to the edge of the inter-row dielectric 222 in the inter-row trenches 220. The second-fin mask 224 may generally define an exposed region with a width 226 and a masked region with a width 228. These features may repeat with a period 230. In some embodiments, the period 230 is generally equal to the period 218 of the first-fin mask 212. The width 228 of the masked regions may be generally equal to or less than 1 F, ½ F, or ¼ F. In certain embodiments, the widths of the masked regions of the second-fin mask 224 are a fraction of the widths 216 of the masked regions of the first-fin mask 212, e.g., generally equal to or less than ¼ or ½ of the width 216. The exposed regions and masked regions of the second-fin mask 224 may be generally straight, generally parallel to a neighboring mask structure, generally parallel to the inter-row dielectric 222, and generally perpendicular to both the deep-isolation trenches 108 and the shallow trenches 110. The second-fin mask 224 may have a generally uniform cross-section through a substantial distance in the X direction, e.g., a distance greater than five transistors.

The second-fin mask 224 may be formed with a variety of techniques. For example, in some embodiments, the second-fin mask 224 is made of photoresist patterned with a photolithography system. In other embodiments, the second-fin mask 224 is formed by double-pitching a mask defined with photolithography. For example, the second-fin mask 224 may be formed by patterning a precursor mask with masked regions disposed between substantially every other masked region of the illustrated second-fin mask 224 and, then, forming the second-fin mask 224 as sidewall spacers on the sides of the precursor mask.

Figure 32:
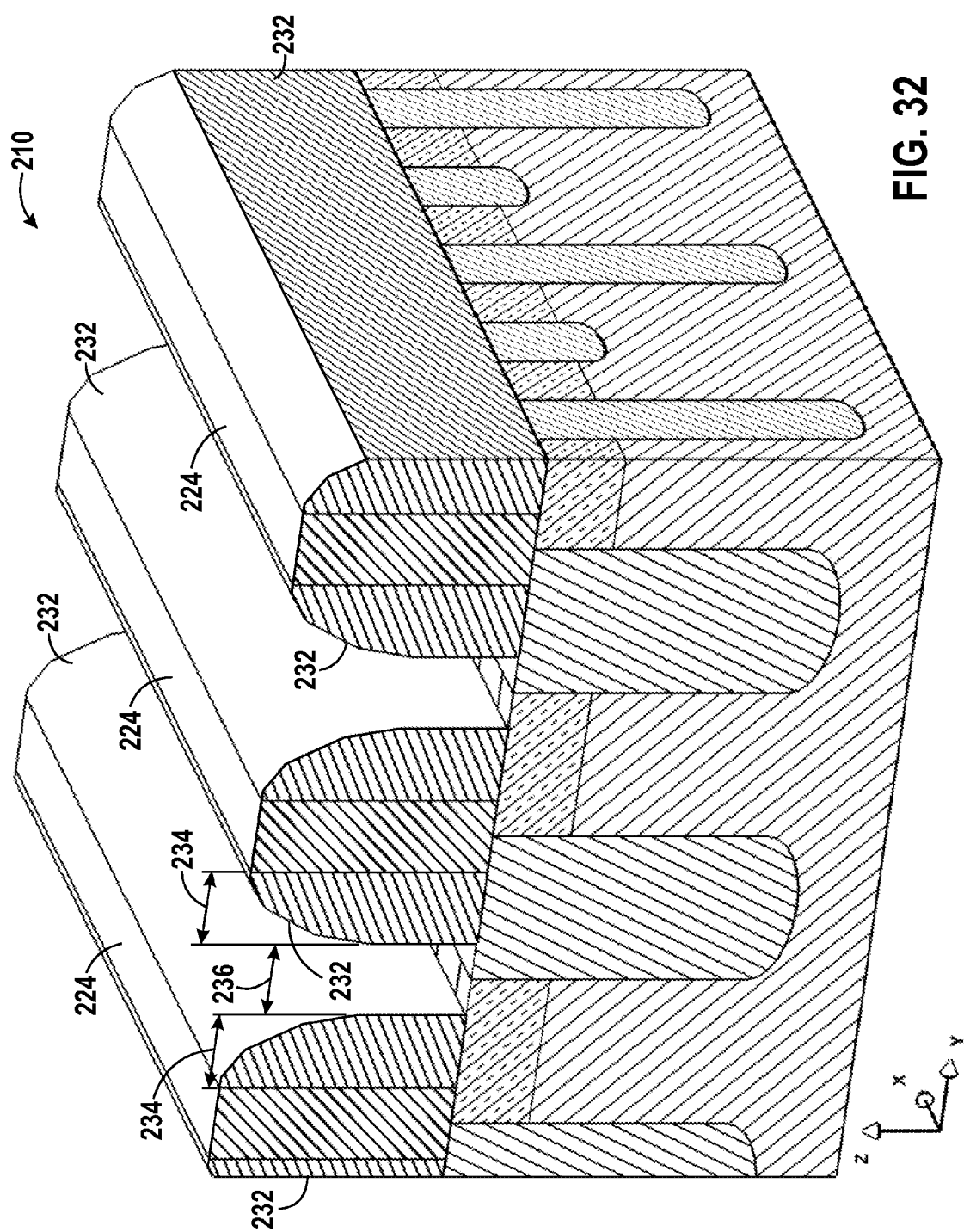

Next, sidewall spacers 232 are formed on the sides of the second-fin mask 224, as illustrated by FIG. 32. The sidewall spacers 232 may be formed by depositing a blanket film on the substrate 210 and, then, anisotropically etching the film. In some embodiments, the sidewall spacers 232 may be made of carbon, and they may have a width 234 that is generally equal to or less than 1 F, ½ F, or ¼ F. The sidewall spacers 232 may define a gap with a width 236 that is generally equal to or less than 1 F, ½ F, or ¼ F.

Figure 33:
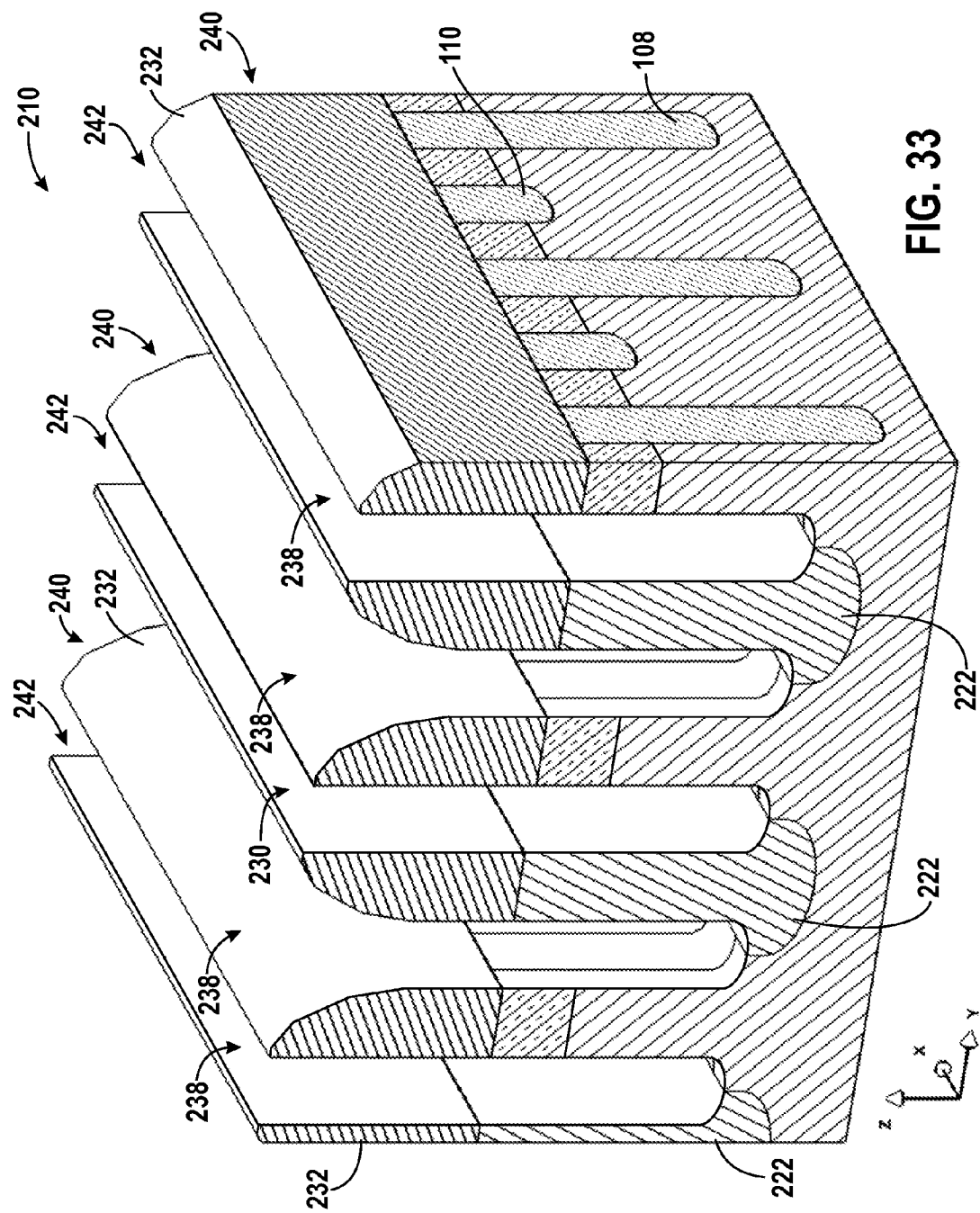

Next, the second-fin mask 224 may be removed and gate trenches 238 may be etched in the substrate 210, as illustrated by FIG. 33. The gate trenches 238 may be formed with a generally anisotropic etch that is masked by the sidewall spacers 232. In some embodiments, the gate trenches 238 are deeper than the shallow trenches 110 but not as deep as either the inter-row dielectric 222 or the deep-isolation trenches 108. The gate trenches 238 may be between 500 Å and 3000 Å deep, e.g., between 1300 Å and 1700 Å. The gate trenches 238 may be generally parallel, generally straight, and generally perpendicular to both the deep-isolation trenches 108 and the shallow trenches 110. In this embodiment, the gate trenches 238 have a generally uniform cross-section in the X direction through a substantial distance, e.g., a distance greater than five transistors.

In some embodiments, forming the gate trenches 238 may also generally simultaneously form fin rows 240 and insulating projections 242. The illustrated insulating projections 242 are interposed between each of the illustrated fin rows 240, and in some embodiments, each fin row 240 is separated from an adjacent insulating projection 242 on either side by gate trenches 238. As with the previous embodiment, because the position and the shape of the illustrated gate trenches 238 are at least partially defined by removing material to form the insulating projections 242, gates formed in the gate trenches 238 are believed to be less likely to short to one another.

Figure 34:
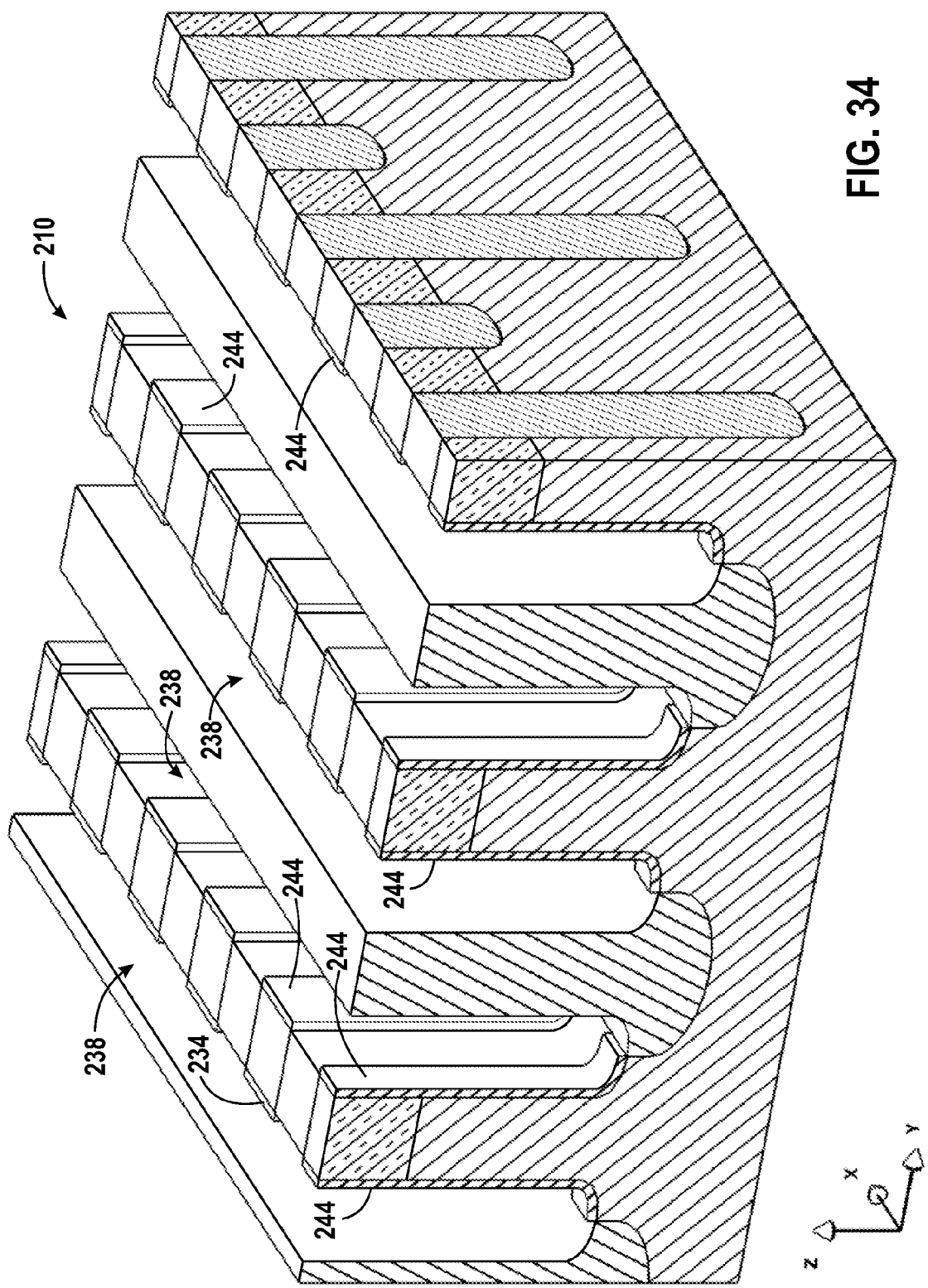

Next, a gate dielectric 244 may be formed in the gate trenches 238, as illustrated by FIG. 34. The gate dielectric 244 may be deposited or grown, and it may be made of a variety of dielectric materials, such as oxide (e.g., silicon dioxide), oxynitride, or high-dielectric constant materials like hafnium dioxide, zirconium dioxide, and titanium dioxide. In some embodiments, the gate dielectric 244 has a thickness less than 300 Å, e.g., between 30 Å and 150 Å.

Figure 35:
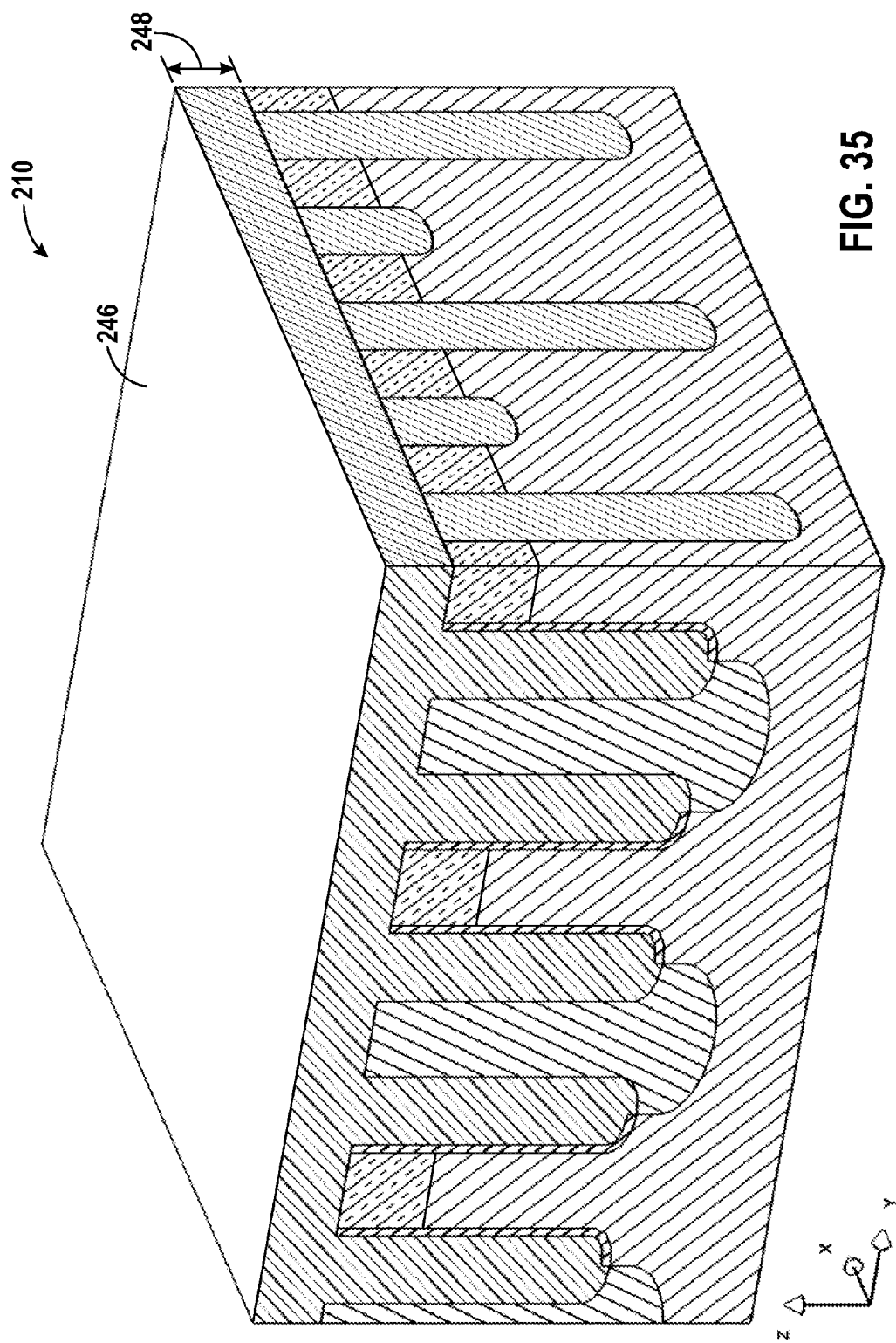

After forming the gate dielectric 244, a gate material 246 may be formed on the substrate 210, as illustrated by FIG. 35. The gate material 246 may be a conductive material deposited with CVD, PVD, or other appropriate processes. In some embodiments, the gate material 246 includes one of the conductive materials listed above. The gate material 246 may be deposited with an overburden 248 to increase the likelihood of all of the gate trenches 238 being filled and to planarize the substrate 210. The gate material 246 may be formed on the substrate 210 before or after removing the spacers 232.

Figure 36:
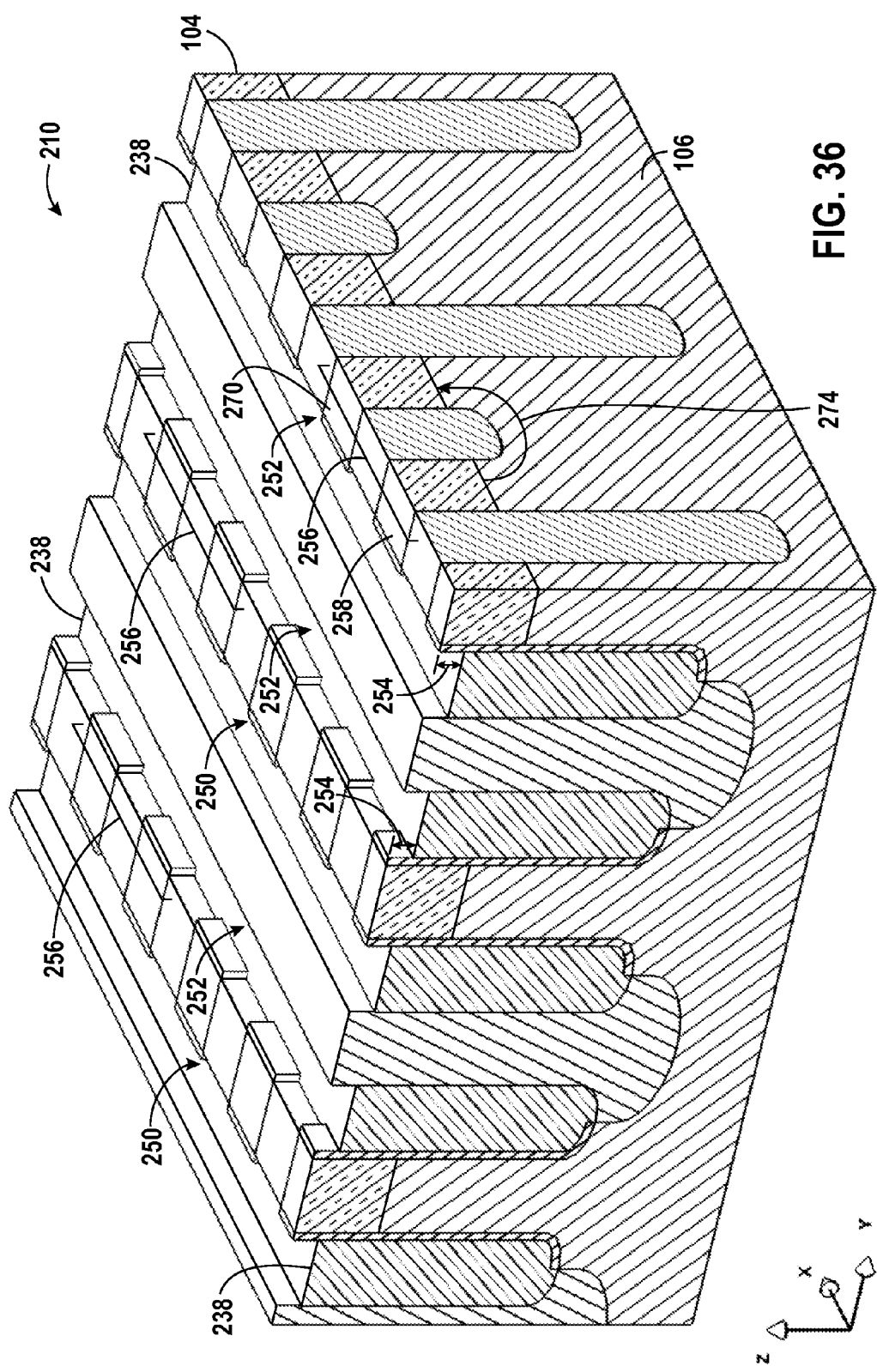

Next, the overburden 248 may be removed and the gate material 246 recessed to form gates 250 and 252, as illustrated by FIG. 36. The gates 250 and 252 may be recessed by a distance 254 selected to reduce the likelihood of residual-gate material 238 connecting gates 250 and 252 on opposite sides of insulating projections 242. The gates 250 and 252 may be recessed with CMP, a dry etch, a wet etch, or a combination thereof. In some embodiments, the gates 250 and 252 overlap the upper-doped region 104 and are not recessed below the bottom of the upper-doped region 104.

At this stage, the substrate 210 may include a plurality of transistors 256. The shape of the semiconductor portion of these transistors 256 is illustrated by FIG. 37. Each illustrated transistor 256 includes a fin 258 rising from a base 260. The fin 258 may include sides 261 and 262, edges 264 and 266, legs 268 and 270, and a generally U-shaped void 272. As with the previous embodiment, the illustrated legs 268 and 270 may function as a source and drain, and an electric field emanating from the gates 252 and 254 may establish channels 274 in either side 260 and 262 of the fin 258.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method, comprising:
   etching an inter-row trench in a substrate;
   substantially or entirely filling the inter-row trench with a dielectric material; and
   forming a fin and an insulating projection at least in part by etching a gate trench in the substrate, wherein the insulating projection includes at least some of the dielectric material in the inter-row trench;
   filling the gate trench with a gate material; and
   recessing the gate material below a top surface of the fin.

2. The method of claim 1, wherein etching the inter-row trench comprises:
   forming precursor trenches in a sacrificial region on the substrate; and
   forming a spacer in the precursor trenches, wherein the spacer narrows the precursor trenches.

3. The method of claim 2, wherein the spacer narrows the trenches to a width that is less than a photolithographic-resolution limit.

4. The method of claim 2, comprising etching the inter-row trenches using the sacrificial region and sidewall spacers as a mask.

5. The method of claim 1, wherein etching an inter-row trench in a substrate comprises etching an inter-row trench through an upper-doped region and at least partially into a lower-doped region.

6. The method of claim 1, wherein substantially or entirely filling the inter-row trench with a dielectric material comprises:
   forming a first liner in the inter-row trench; and
   applying a spun-on-dielectric to the substrate.

7. The method of claim of claim 1, comprising:
   masking the etch of the inter-row trench with a sacrificial material and a first sidewall spacer; and
   removing the sacrificial material after substantially or entirely filling the inter-row trench with the dielectric material.

8. The method of claim 7, comprising:
   forming a second sidewall spacer on a surface of the first sidewall spacer following removal of the sacrificial material; and
   masking the etch of the gate trench at least in part with the second sidewall spacer.

9. The method of claim 1, wherein forming a fin and an insulating projection at least in part by etching a gate trench in the substrate comprises etching a portion of the dielectric material.

10. The method of claim 1, wherein forming a fin and an insulating projection at least in part by etching a gate trench in the substrate comprises forming a plurality of fin rows and a plurality of insulating projections generally simultaneously by etching a plurality of gate trenches.

11. The method of claim 10, wherein:
    each insulating projection among the plurality of insulating projections is interposed between a pair of fin rows among the plurality of fin rows, and
    a gate trench among the plurality of gate trenches is disposed on either side of each fin row among the plurality of fin rows between the fin row and an adjacent insulating projection among the plurality of insulating projections.

12. The method of claim 1, wherein:
    etching an inter row-trench in the substrate comprises forming a first mask on the substrate with a photolithography step, and
    forming a fin and an insulating projection at least in part by etching a gate trench in the substrate comprises forming a second mask on the substrate with a second photolithography step.

13. The method of claim 12, wherein the second mask is shifted with respect to the first mask by a distance generally equal to half of a pitch of the first mask.

14. The method of claim 13, wherein:
    forming the first mask comprises forming the first mask with a first photolithographic tool;
    forming the second mask comprises forming the second mask with a second photolithographic tool, wherein a resolution of the second photolithographic tool is generally as large as or larger than twice a resolution of the first photolithographic tool.

15. The method of claim 13, wherein forming the second mask comprising double-pitching a precursor mask.

16. A method, comprising:
    forming a first plurality of trenches in a substrate that are generally parallel to one another;
    forming a second plurality of trenches in the substrate that are generally parallel to one another and generally perpendicular to the first plurality of trenches; and
    forming a third plurality of trenches in the substrate that are generally parallel to the second plurality of trenches and misaligned with respect to the second plurality of trenches by a distance that is less than a period of the second plurality.

17. The method of claim 16, comprising at least substantially filling both the first plurality of trenches and the second plurality of trenches with a dielectric material before forming the third plurality of trenches.

18. The method of claim 16, wherein forming the third plurality of trenches comprises generally simultaneously forming a plurality of gate trenches, a plurality of insulating projections, and a plurality of fin rows.

19. The method of claim 18, comprising:
    forming a conductive region disposed at least in part in the plurality of gate trenches; and recessing the conductive region into the plurality of gate trenches.

20. The method of claim 1, wherein filling the gate trench with a gate material comprises completely filling the gate trench with the material.

21. The method of claim 1, wherein the gate material is recessed less than or equal to 1000 angstroms below the top surface of the fin.

22. The method of claim 1, wherein the gate material partially overlaps the upper-doped region.

* * * * *

UNITED STATES PATENT AND TRADEMARK OFFICE
CERTIFICATE OF CORRECTION

PATENT NO. : 8,866,254 B2
APPLICATION NO. : 12/033780
DATED : October 21, 2014
INVENTOR(S) : Werner Juengling Page 1 of 1

It is certified that error appears in the above-identified patent and that said Letters Patent is hereby corrected as shown below:

In the Claims

In column 11, line 34, in Claim 1, after "material;" delete "and".

Signed and Sealed this
Twenty-third Day of December, 2014

Michelle K. Lee
*Deputy Director of the United States Patent and Trademark Office*